(12) United States Patent
Cho et al.

(10) Patent No.: US 12,424,270 B2
(45) Date of Patent: Sep. 23, 2025

(54) SEMICONDUCTOR MEMORY DEVICE AND MEMORY MODULE HAVING VARIOUS OPERATION MODES

(71) Applicant: SAMSUNG ELECTRONICS CO., LTD., Suwon-si (KR)

(72) Inventors: Gunhee Cho, Suwon-si (KR); Wonyoung Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 217 days.

(21) Appl. No.: 18/315,571

(22) Filed: May 11, 2023

(65) Prior Publication Data
US 2024/0096404 A1 Mar. 21, 2024

(30) Foreign Application Priority Data
Sep. 20, 2022 (KR) .......................... 10-2022-0118840

(51) Int. Cl.
*G11C 7/10* (2006.01)
*G11C 11/4076* (2006.01)
(Continued)

(52) U.S. Cl.
CPC ...... *G11C 11/4093* (2013.01); *G11C 11/4076* (2013.01); *G11C 11/4087* (2013.01); *G11C 11/4096* (2013.01); *G11C 29/50012* (2013.01)

(58) Field of Classification Search
CPC ............ G11C 11/4093; G11C 11/4076; G11C 11/4087; G11C 11/4096; G11C 29/50012
See application file for complete search history.

(56) References Cited

U.S. PATENT DOCUMENTS

| 6,385,688 B1 * | 5/2002 | Mills .................. G06F 12/0607 711/100 |
| 7,936,639 B2 | 5/2011 | Ba et al. |

(Continued)

FOREIGN PATENT DOCUMENTS

| CN | 113874940 | 12/2021 |
| CN | 1137060181 | 12/2021 |

(Continued)

OTHER PUBLICATIONS

Office Action dated May 24, 2024 in corresponding Taiwan Patent Application No. 112117999.

*Primary Examiner* — Min Huang
(74) *Attorney, Agent, or Firm* — MORGAN, LEWIS & BOCKIUS LLP

(57) ABSTRACT

A semiconductor memory device includes a receiving circuit, a multiplexing circuit, a decoding circuit and a memory cell array. The receiving circuit receives a plurality of input command/address (CA) signals, and generates a plurality of CA signal groups based on the input CA signals and a clock signal. The multiplexing circuit operates in one of a first operation mode and a second operation mode based on a mode selection signal, outputs the plurality of CA signal groups as a plurality of selected CA signal groups in the first operation mode, and generates the plurality of selected CA signal groups by multiplexing the plurality of sub-CA signals included in the plurality of CA signal groups in the second operation mode. The decoding circuit generates a plurality of output CA signals based on the plurality of selected CA signal groups.

20 Claims, 21 Drawing Sheets

(51) Int. Cl.
  *G11C 11/408* (2006.01)
  *G11C 11/4093* (2006.01)
  *G11C 11/4096* (2006.01)
  *G11C 29/50* (2006.01)

(56) References Cited

U.S. PATENT DOCUMENTS

| | | | |
|---|---|---|---|
| 7,990,800 | B2 | 8/2011 | Huang |
| 8,441,886 | B2 | 5/2013 | Ba et al. |
| 8,717,828 | B2 | 5/2014 | Kim et al. |
| 8,755,247 | B2 | 6/2014 | Ba et al. |
| 8,811,110 | B2 | 8/2014 | Schaefer et al. |
| 9,251,863 | B2 | 2/2016 | Kim et al. |
| 10,223,299 | B2 | 3/2019 | Ware et al. |
| 10,559,550 | B2 | 2/2020 | Lee et al. |
| 10,566,038 | B2 | 2/2020 | Son et al. |
| 10,796,746 | B2 | 10/2020 | Gans et al. |
| 10,997,097 | B2 | 5/2021 | Bhatia et al. |
| 11,276,440 | B2 | 3/2022 | Perego et al. |
| 11,386,940 | B2 | 7/2022 | Kim |
| 11,675,728 | B2 | 6/2023 | Leslie et al. |
| 11,948,661 | B2 | 4/2024 | Stave et al. |
| 2017/0236566 | A1 | 8/2017 | Nukala et al. |
| 2019/0180803 | A1* | 6/2019 | Jung ............... G11C 7/1015 |
| 2019/0378565 | A1* | 12/2019 | Yuan ................. G11C 7/04 |
| 2020/0356499 | A1 | 11/2020 | Ware et al. |
| 2021/0125977 | A1 | 4/2021 | Lendvay |
| 2021/0318956 | A1 | 10/2021 | Keeth et al. |
| 2022/0121393 | A1 | 4/2022 | Keeth |

FOREIGN PATENT DOCUMENTS

| | | |
|---|---|---|
| CN | 113889161 | 1/2022 |
| JP | 4430343 | 12/2009 |
| KR | 10-1536019 | 7/2015 |
| KR | 10-1854251 | 4/2018 |
| TW | 1401694 | 7/2013 |
| TW | 1763803 | 5/2022 |

* cited by examiner

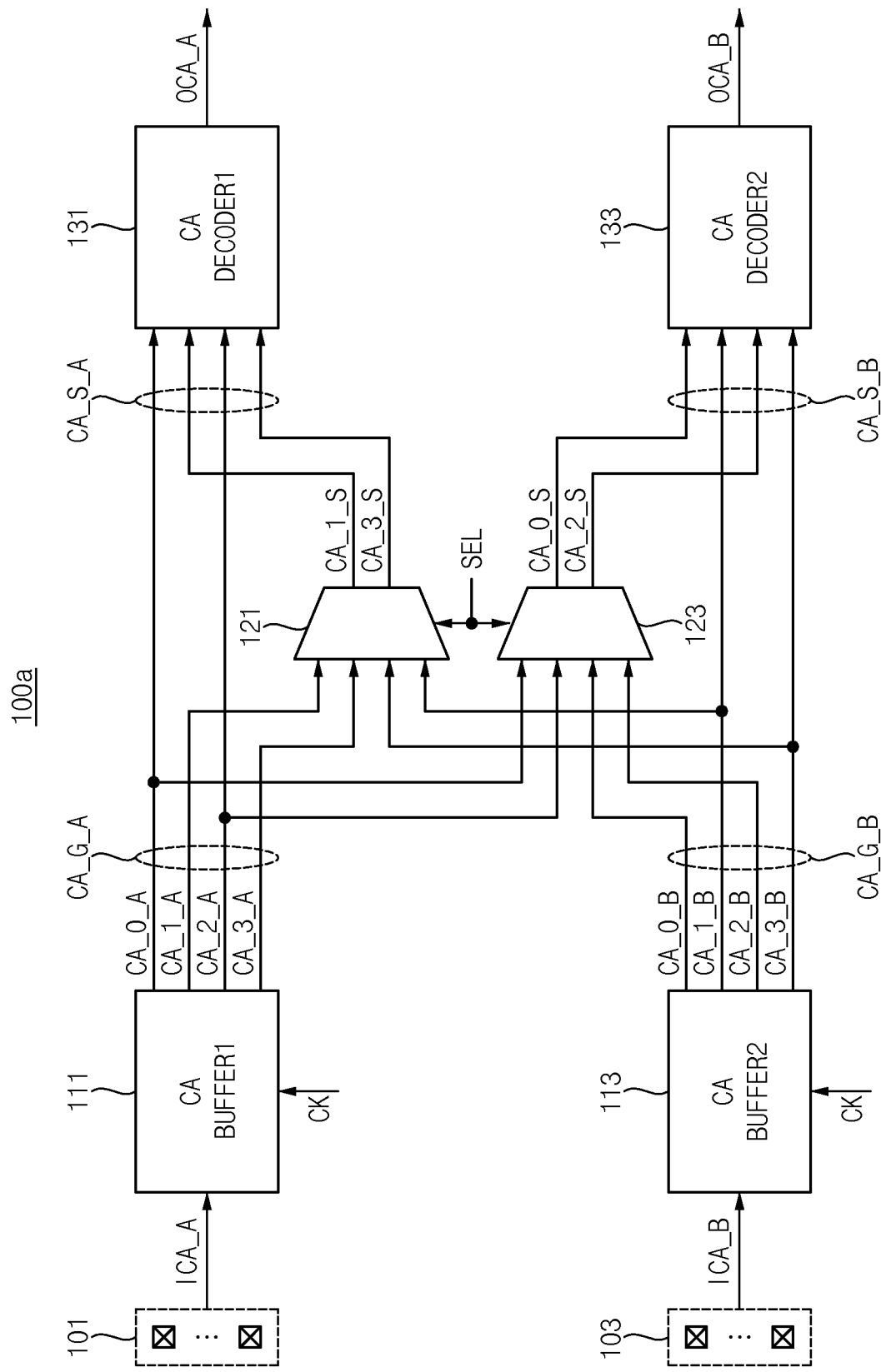

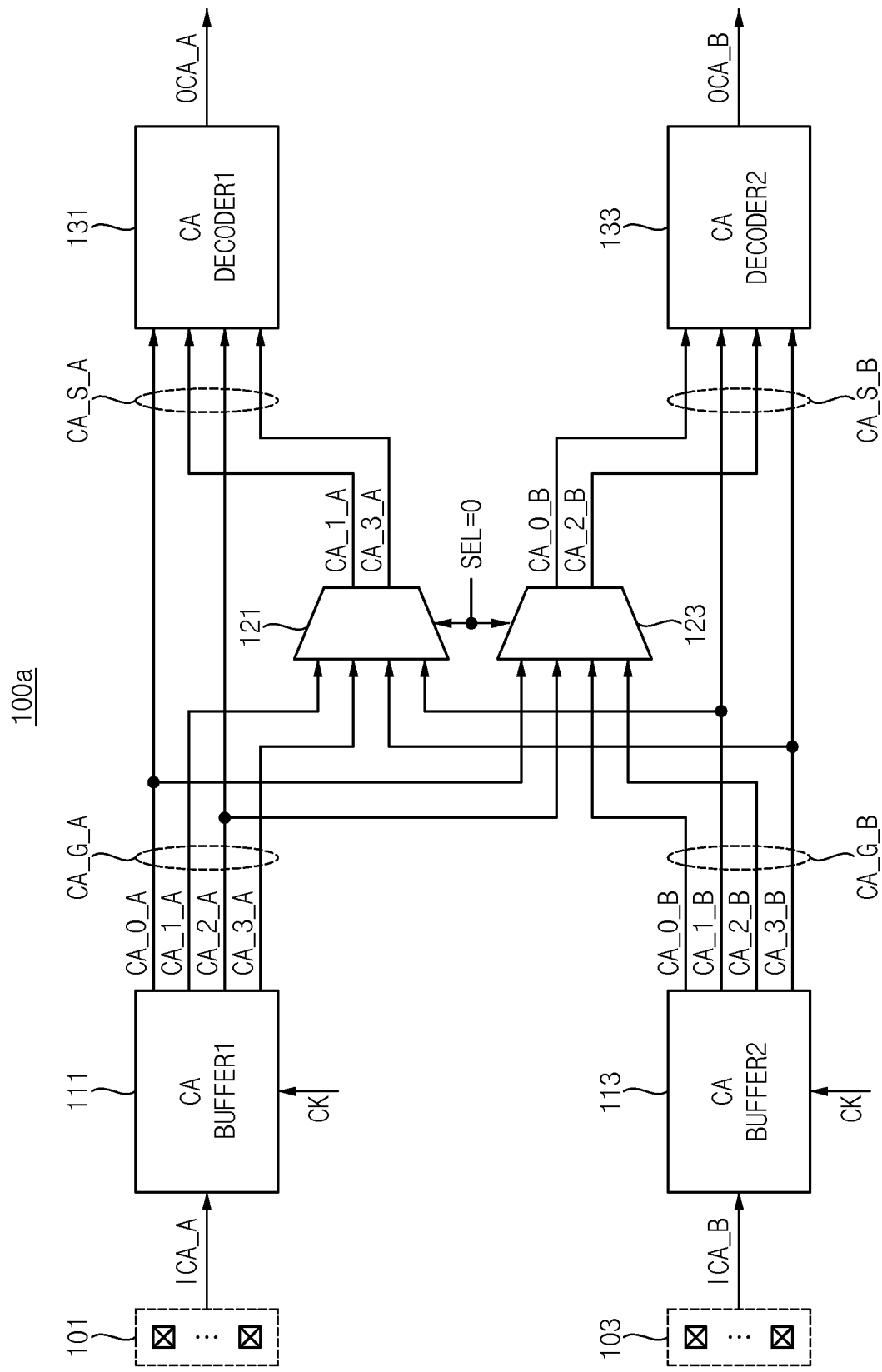

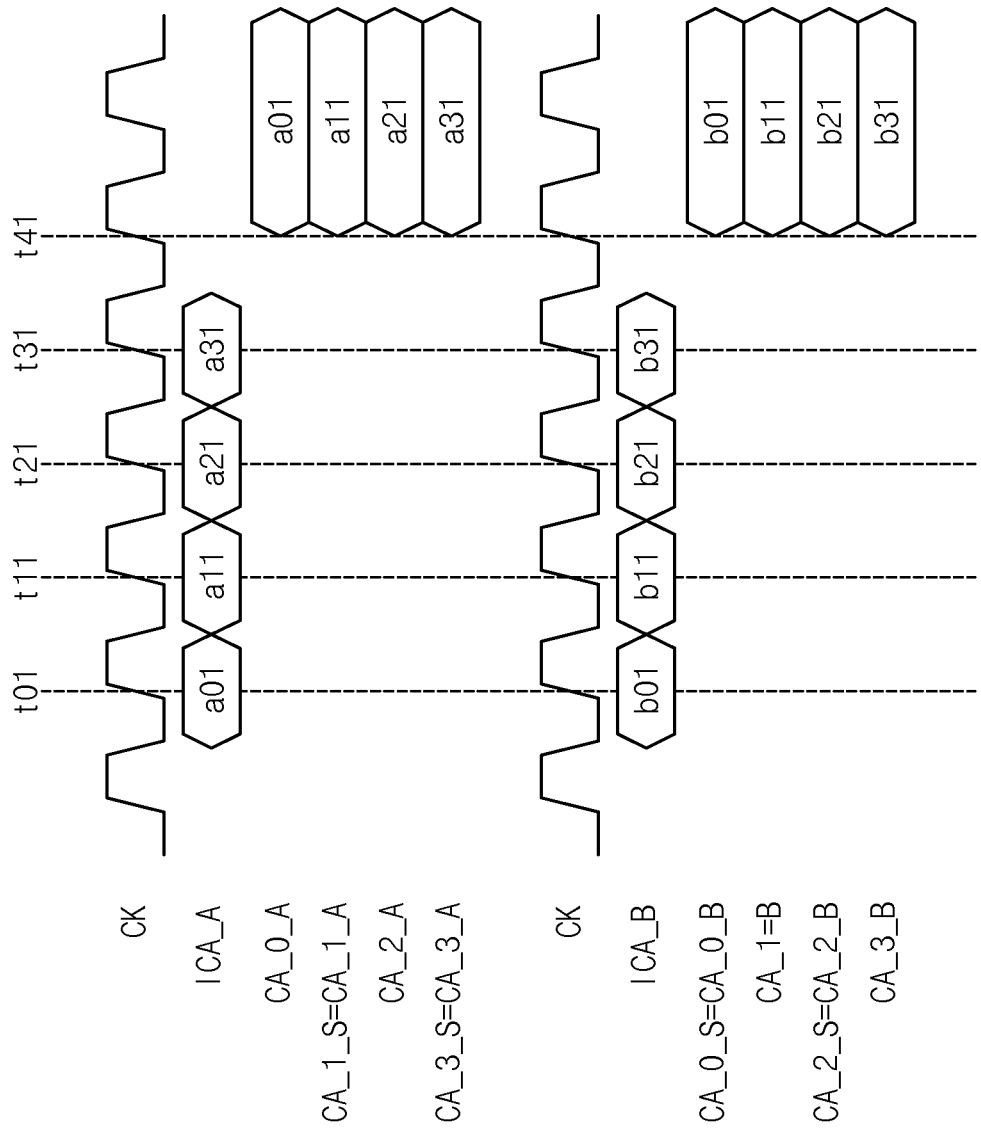

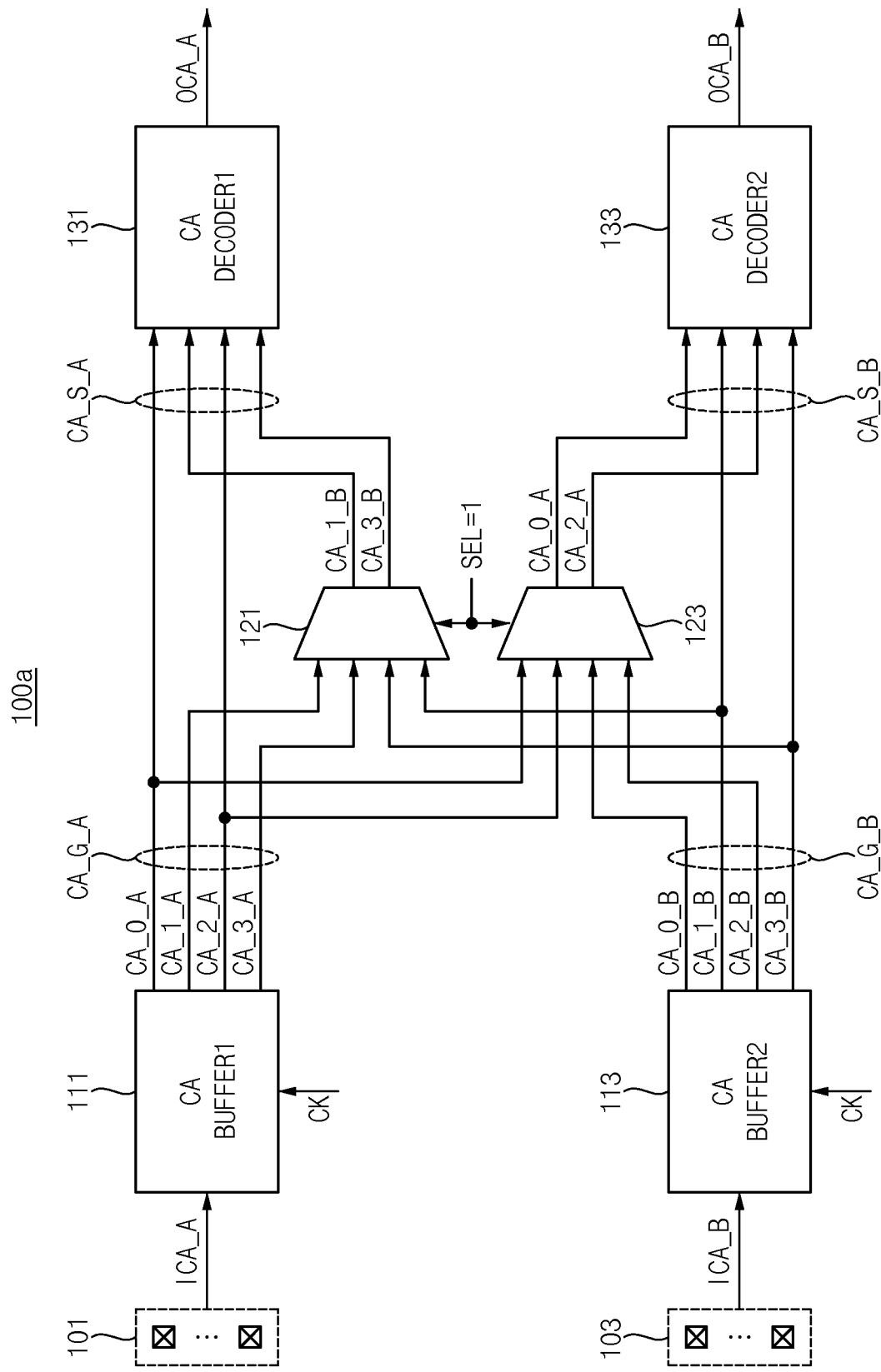

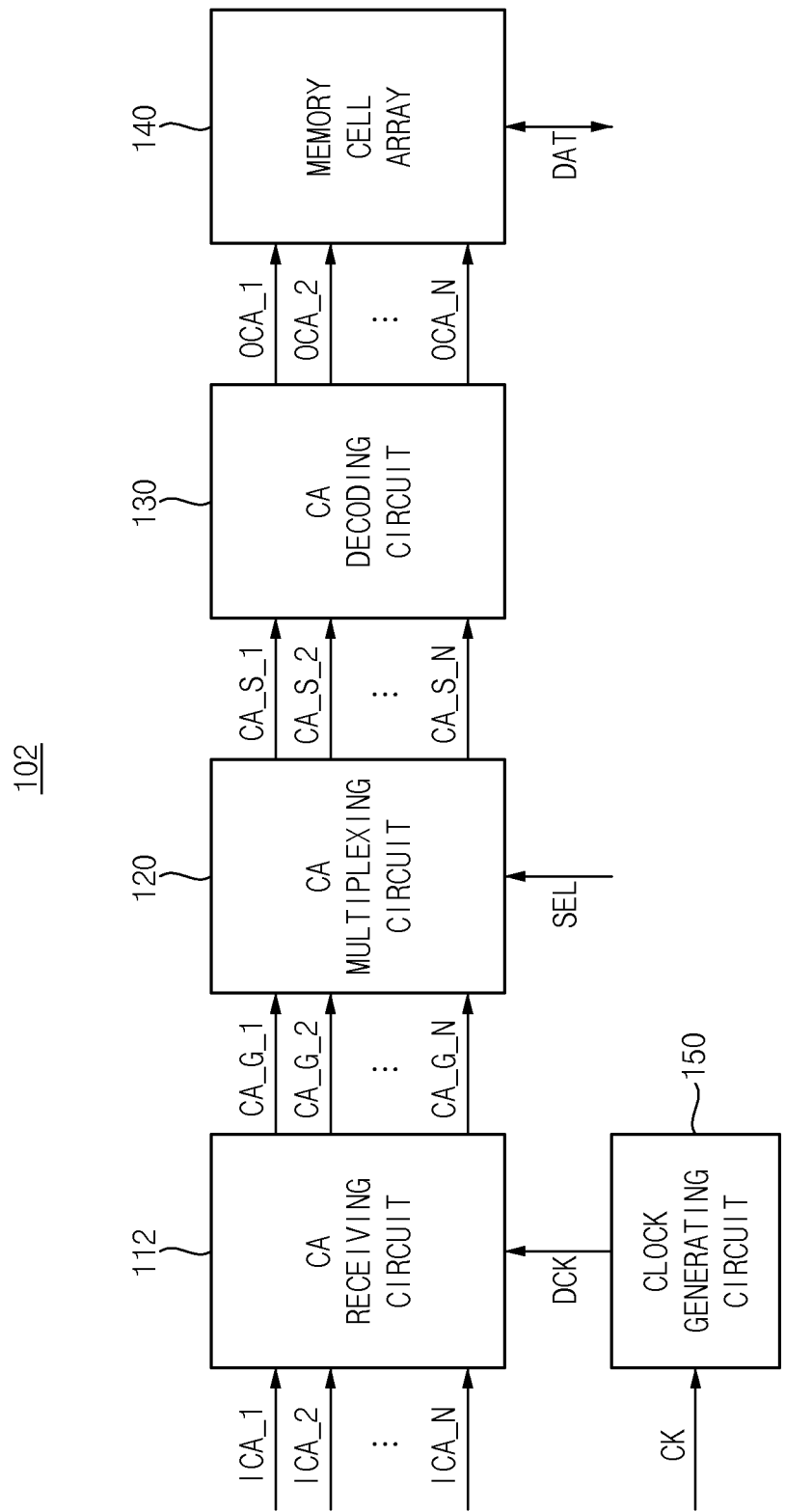

SEMICONDUCTOR MEMORY DEVICE AND MEMORY MODULE HAVING VARIOUS OPERATION MODES

CROSS-REFERENCE TO RELATED APPLICATION

This U.S. non-provisional patent application claims priority under 35 USC § 119 to Korean Patent Application No. 10-2022-0118840 filed on Sep. 20, 2022 in the Korean Intellectual Property Office (KIPO), the disclosure of which is incorporated by reference in its entirety herein.

1. TECHNICAL FIELD

Example embodiments relate generally to semiconductor integrated circuits, and more particularly to semiconductor memory devices and memory modules having various operation modes.

2. DISCUSSION OF RELATED ART

Semiconductor memory devices may be classified into nonvolatile memory devices such as flash memories and volatile memory devices such as dynamic random access memories (DRAMs). Volatile memory devices capable of operating at a high speed and being manufactured at a low cost are ideal for use as system memories.

As the integration degree and capacity of semiconductor memory devices increase, so do data transfer rates. However, these data transfer rates may exceed the speed limit of test equipment, which can prevent adequate testing of a semiconductor memory device. In addition, a plurality of semiconductor memory devices may be provided in the form of a memory module to achieve a larger capacity. Therefore, techniques for implementing semiconductor memory devices and memory modules are needed to support high speed data transfer rates.

SUMMARY

At least one example embodiment of the present disclosure provides a semiconductor memory device and/or a memory module capable of operating in different operation modes depending on the rate or speed of receiving command/address (CA) signals.

For example, at least one semiconductor memory device and memory module is disclosed herein that is capable of supporting a normal operation mode and a low-speed operation mode that is slower than the normal operation mode.

According to an example embodiment, a semiconductor memory device includes a receiving circuit, a multiplexing circuit, a decoding circuit and a memory cell array. The receiving circuit receives a plurality of input command/address (CA) signals, and generates a plurality of CA signal groups based on the input CA signals and a clock signal. Each of the plurality of CA signal groups includes a plurality of sub-CA signals. The multiplexing circuit operates in one of a first operation mode and a second operation mode based on a mode selection signal, operates on the plurality of CA signal groups to generate a plurality of selected CA signal groups each including the sub-CA signals from a single one of the input CA signals during a first operation mode, and operates on the plurality of CA signal groups to generate the plurality of selected CA signal groups so that each includes the sub-CA signals from at least two of the input CA signals during the second operation mode. The decoding circuit generates a plurality of output CA signals based on the plurality of selected CA signal groups. The memory cell array operates based on the plurality of output CA signals.

According to an example embodiment, a memory module includes a circuit board, a plurality of semiconductor memory devices on the circuit board, and a buffer chip on the circuit board. The buffer chip controls the plurality of semiconductor memory devices, and includes a receiving circuit, a multiplexing circuit and a decoding circuit. The receiving circuit receives a plurality of input command/address (CA) signals, and generates a plurality of CA signal groups based on the input CA signals and a clock signal. Each of the plurality of CA signal groups includes a plurality of sub-CA signals. The multiplexing circuit operates in one of a first operation mode and a second operation mode based on a mode selection signal, operates on the plurality of CA signal groups to generate a plurality of selected CA signal groups each including the sub-CA signals from a single one of the input CA signals during a first operation mode, and operates on the plurality of CA signal groups to generate the plurality of selected CA signal groups so that each includes the sub-CA signals from at least two of the input CA signals during the second operation mode. The decoding circuit generates a plurality of output CA signals based on the plurality of selected CA signal groups. The plurality of semiconductor memory devices operate based on the plurality of output CA signals.

According to an example embodiment, a semiconductor memory device includes a first buffer, a second buffer, a first multiplexer, a second multiplexer, a first decoder, a second decoder and a memory cell array. The first buffer receives a first input command/address (CA) signal through a first channel, and generates first through X-th sub-CA signals based on a clock signal and the first input CA signal, where X is an even number greater than or equal to two. The second buffer receives a second input CA signal through a second channel different from the first channel, and generates $(X+1)$-th to $2X$-th sub-CA signals based on the clock signal and the second input CA signal. The first multiplexer outputs the first to $X/2$-th sub-CA signals as first to $X/2$-th selected CA signals in a first operation mode, and outputs the $(X+1)$-th to $3X/2$-th sub-CA signals as the first to $X/2$-th selected CA signals in a second operation mode. The second multiplexer outputs the $(3X/2+1)$-th to $2X$-th sub-CA signals as $(X/2+1)$-th to X-th selected CA signals in the first operation mode, and outputs the $(X/2+1)$-th to X-th sub-CA signals as the $(X/2+1)$-th to X-th selected CA signals in the second operation mode. The first CA decoder generates a first output CA signal based on the first to $X/2$-th selected CA signals and the $(X/2+1)$-th to X-th sub-CA signals. The second CA decoder generates a second output CA signal based on the $(X/2+1)$-th to X-th selected CA signals and the $(X+1)$-th to $3X/2$-th sub-CA signals. The memory cell array includes a first memory region operating based on the first output CA signal, and a second memory region operating independently of the first memory region based on the second output CA signal. The second operation mode is a test mode in which a test operation is performed on the memory cell array. A rate of receiving the first and second input CA signals in the second operation mode is slower than a rate of receiving the first and second input CA signals in the first operation mode.

In a semiconductor memory device and a memory module according to at least one example embodiment, the semiconductor memory device may operate in different operation modes depending on the rate (or speed) of receiving the CA signals. For example, in a first operation mode in which the rate of receiving the input CA signals is relatively fast, one output CA signal may be generated using a single input CA signal. For example, in a second operation mode in which the rate of receiving the input CA signals is relatively slow, one output CA signal may be generated by multiplexing or combining two or more input CA signals. As described above, the semiconductor memory device may be implemented to support various operation modes. Accordingly, the semiconductor memory device may operate normally even when the rate of receiving the CA signals is relatively slow, and thus the semiconductor memory device may be applied or employed to various application fields.

BRIEF DESCRIPTION OF THE DRAWINGS

Illustrative, non-limiting example embodiments will be more clearly understood from the following detailed description taken in conjunction with the accompanying drawings.

FIG. 4 is a block diagram illustrating an example of a semiconductor memory device of FIG. 1.

FIGS. 5A, 5B, 6A and 6B are diagrams for describing an operation of a semiconductor memory device of FIG. 4.

FIG. 7 is a block diagram illustrating a semiconductor memory device according to an example embodiment.

DETAILED DESCRIPTION OF THE EMBODIMENTS

Figure 1:
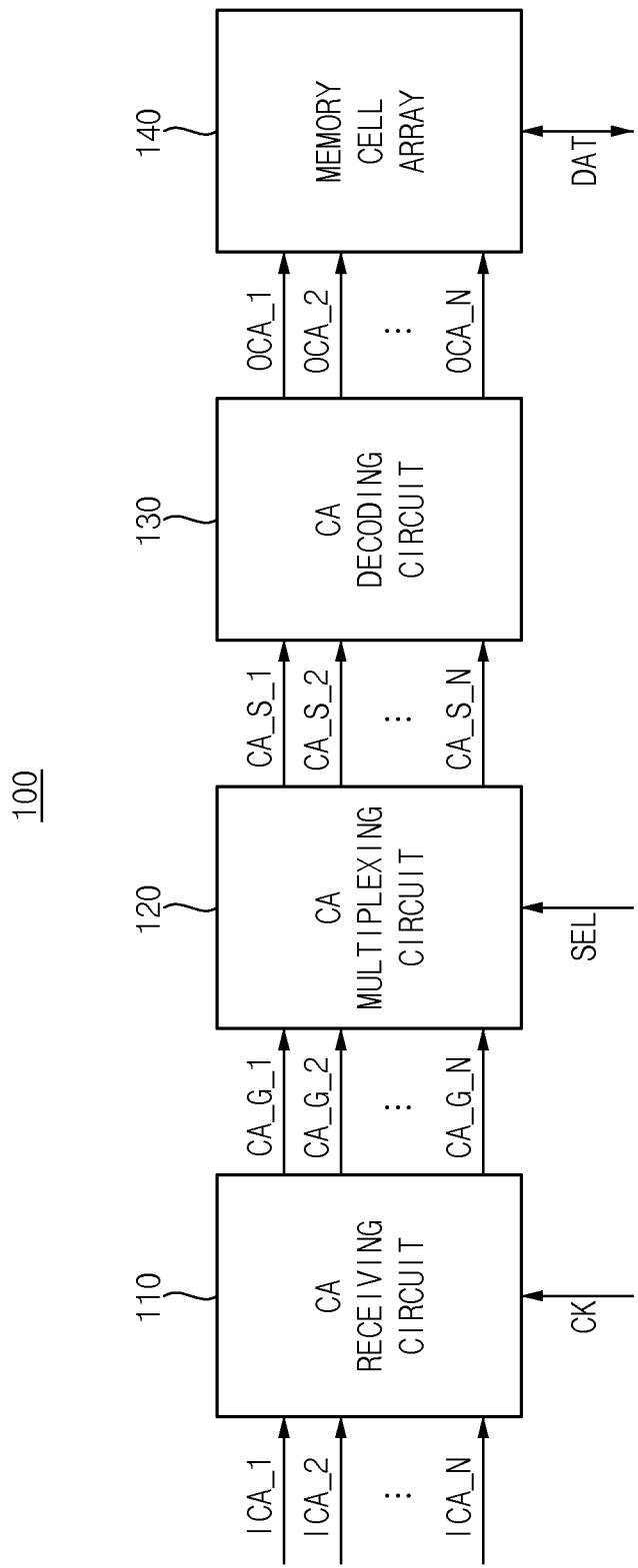
FIG. 1 is a block diagram illustrating a semiconductor memory device according to an example embodiment.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

FIG. 1 is a block diagram illustrating a semiconductor memory device according to an example embodiment.

Referring to FIG. 1, a semiconductor memory device 100 includes a receiving circuit 110, a multiplexing circuit 120, a decoding circuit 130 and a memory cell array 140.

The receiving circuit 110 receives a plurality of input command/address (CA) signals ICA_1, ICA_2, . . . , ICA_N, and generates a plurality of CA signal groups CA_G_1, CA_G_2, . . . , CA_G_N based on a clock signal CK and the plurality of input CA signals ICA_1 to ICA_N. For example, the clock signal CK may be a signal that periodically transitions from a first logic state to a second logic state different from the first logic. Each of the plurality of CA signal groups CA_G_1 to CA_G_N includes a plurality of sub-CA signals. The plurality of input CA signals ICA_1 to ICA_N may include command information and/or address information that are used to control an operation of the semiconductor memory device 100. The receiving circuit 110 may be referred to as a CA receiving circuit.

For example, the plurality of input CA signals ICA_1 to ICA_N may include first to N-th input CA signals, where N is a positive greater than or equal to two. For example, the plurality of CA signal groups CA_G_1 to CA_G_N may include first to N-th CA signal groups. For example, each of the first to N-th CA signal groups may include first to M-th sub-CA signals, where M is a positive integer greater than or equal to two. For example, each of the first to N-th CA signal groups may correspond to a respective one of the first to N-th input CA signals. For example, the first CA signal group CA_G_1 may be generated based on the clock signal CK and the first input CA signal ICA_1.

In an example embodiment, the clock signal CK may be received from an external source located outside of the semiconductor memory device 100 (e.g., from a memory controller). In an example embodiment, the clock signal CK is generated inside the semiconductor memory device 100.

The multiplexing circuit 120 operates in one of a first operation mode and a second operation mode based on a mode selection signal SEL. The mode selection signals SEL may be set to a first voltage level to enter the first operation mode and a second voltage level different from the first voltage level to enter the second operation mode. Since the multiplexing circuit 120 operates in one of the first operation mode and the second operation mode, the semiconductor memory device 100 may also operate in one of the first operation mode and the second operation mode.

In the first operation mode, the multiplexing circuit 120 outputs the plurality of CA signal groups CA_G_1 to CA_G_N as a plurality of selected CA signal groups CA_S_1, CA_S_2, . . . , CA_S_N, without multiplexing the plurality of CA signal groups CA_G_1 to CA_G_N. In the second operation mode, the multiplexing circuit 120 generates the plurality of selected CA signal groups CA_S_1 to CA_S_N by multiplexing the plurality of sub-CA signals included in the plurality of CA signal groups CA_G_1 to CA_G_N. The multiplexing circuit 120 may be referred to as a CA multiplexing circuit.

For example, the plurality of selected CA signal groups CA_S_1 to CA_S_N may include first to N-th selected CA signal groups. For example, each of the first to N-th selected CA signal groups may correspond to at least one of the first to N-th CA signal groups. For example, in the first operation mode, the first selected CA signal group CA_S_1 may be generated based on the first CA signal group CA_G_1 (e.g., based on the first input CA signal ICA_1), and the first selected CA signal group CA_S_1 may be substantially the same as the first CA signal group CA_G_1. For example, in the second operation mode, the first selected CA signal group CA_S_1 may be generated based on the first CA signal group CA_G_1 and at least one of other CA signal groups (e.g., based on the first input CA signal ICA_1 and at least one of other input CA signals), and the first selected CA signal group CA_S_1 may include a part (or portion) of the first CA signal group CA_G_1 and a part of at least one of other CA signal groups and may be generated by combining (e.g., multiplexing or mixing) a part of the first CA signal group CA_G_1 and a part of at least one of other CA signal groups. For example, in the second operation mode, the first selected CA signal group CA_S_1 could be generated by multiplexing, mixing, or combining the first input CA signal ICA_1 and the second input CA signal ICA_2.

In an example embodiment, the mode selection signal SEL is received from an external source located outside of the semiconductor memory device 100 (e.g., from the memory controller). For example, the first operation mode or the second operation mode may be selected depending on an external control (e.g., under a control by a user).

The decoding circuit 130 generates a plurality of output CA signals OCA_1, OCA_2, . . . OCA_N based on the plurality of selected CA signal groups CA_S_1 to CA_S_N. As with the plurality of input CA signals ICA_1 to ICA_N, the plurality of output CA signals OCA_1 to OCA_N may include command information and/or address information that are used to control the operation of the semiconductor memory device 100. The decoding circuit 130 may be referred to as a CA decoding circuit.

For example, the plurality of output CA signals OCA_1 to OCA_N may include first to N-th output CA signals. For example, each of the first to N-th output CA signals may correspond to a respective one of the first to N-th selected CA signal groups. For example, the first output CA signal OCA_1 may be generated based on the first selected CA signal group CA_S_1.

As described above, in the first operation mode, the first selected CA signal group CA_S_1 may be generated based on the first CA signal group CA_G_1 (e.g., based on the first input CA signal ICA_1), and thus the first output CA signal OCA_1 may be generated using (e.g., by decoding) only the first input CA signal ICA_1. For example, in the first operation mode, the first output CA signal OCA_1 could be the first input CA signal ICA_1. In addition, in the second operation mode, the first selected CA signal group CA_S_1 may be generated based on the first CA signal group CA_G_1 and at least one of other CA signal groups (e.g., based on the first input CA signal ICA_1 and at least one of other input CA signals), and thus the first output CA signal OCA_1 may be generated using (e.g., by decoding) the first input CA signal ICA_1 and at least one of other input CA signals. For example, in the second operation mode, the first output CA signal OCA_1 could include two signals such as the first input CA signal ICA_1 and another signal such as the second input CA signal ICA_2 or another input CA signal.

The memory cell array 140 operates based on the plurality of output CA signals OCA_1 to OCA_N. For example, based on the plurality of output CA signals OCA_1 to OCA_N, the memory cell array 140 may perform a write operation to store data DAT or a read operation to output stored data DAT.

In an example embodiment, the first operation mode is a normal operation mode in which the semiconductor memory device 100 operates with a first operation speed (or rate), and the second operation mode is a low-speed operation mode in which the semiconductor memory device 100 operates with a second operation speed slower than the first operation speed. For example, a rate (or signal rate) of receiving the plurality of input CA signals ICA_1 to ICA_N in the second operation mode may be slower than a rate of receiving the plurality of input CA signals ICA_1 to ICA_N in the first operation mode.

In an example embodiment, the first operation mode is a general operation mode in which the semiconductor memory device 100 performs the write operation, the read operation, and the like, and the second operation mode is a test mode in which a test operation is performed on the semiconductor memory device 100 (e.g., the test operation is performed on the memory cell array 140).

In the semiconductor memory device 100 according to an example embodiment, the semiconductor memory device 100 operates in two or more operation modes depending on the rate (or speed) of receiving the CA signals. For example, in the first operation mode in which the rate of receiving the input CA signals is relatively fast, one output CA signal may be generated using only one input CA signal. For example, in the second operation mode in which the rate of receiving the input CA signals is relatively slow, one output CA signal may be generated by multiplexing or combining two or more input CA signals. As described above, the semiconductor memory device 100 may be implemented to support various operation modes. Accordingly, the semiconductor memory device 100 may operate normally even when the rate of receiving the CA signals is relatively slow, and thus the semiconductor memory device 100 may be applied or employed to various application fields.

In addition, even if the semiconductor memory device 100 has relatively high operation speed and the rate of receiving the CA signals is relatively fast, the test operation may be performed on the semiconductor memory device 100 using test equipment in which the rate of transmitting the CA signals is relatively slow. Accordingly, the semiconductor memory device 100 may be tested with a relatively low cost.

Figure 2:
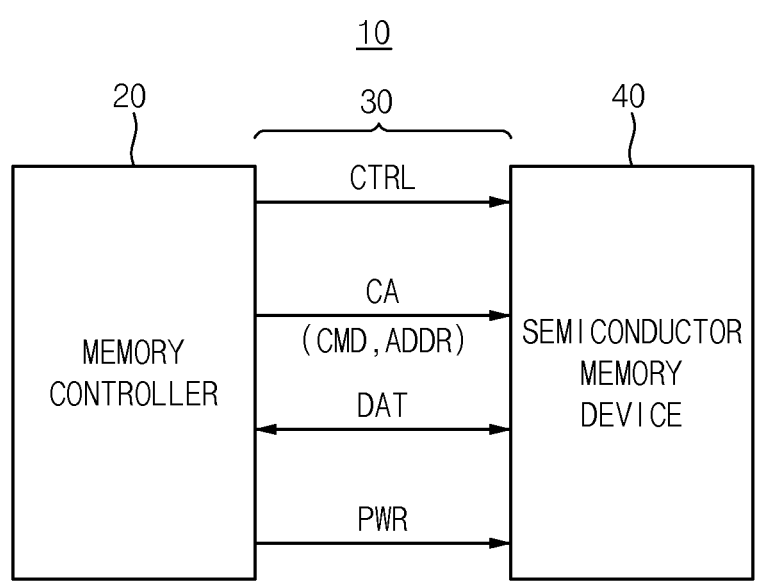
FIG. 2 is a block diagram illustrating a memory system including a semiconductor memory device according to an example embodiment.

FIG. 2 is a block diagram illustrating a memory system including a semiconductor memory device according to an example embodiment.

Referring to FIG. 2, a memory system 10 includes a memory controller 20 (e.g., a memory control circuit) and a semiconductor memory device 40. The memory system 10 may further include a plurality of signal lines 30 that electrically connect the memory controller 20 with the semiconductor memory device 40.

The semiconductor memory device 40 is controlled by the memory controller 20. For example, based on requests from a host device, the memory controller 20 may store (e.g., write or program) data into the semiconductor memory device 40, or may retrieve (e.g., read or sense) data from the semiconductor memory device 40.

The plurality of signal lines 30 may include control lines, command/address (CA) lines, data input/output (I/O) lines and power lines. The memory controller 20 may transmit a CA signal CA to the semiconductor memory device 40 via the CA lines and a control signal CTRL to the semiconductor memory device 40 via the control lines, may exchange data DAT with the semiconductor memory device 40 via the data I/O lines, and may transmit a power supply voltage PWR to the semiconductor memory device 40 via the power lines. The CA signal CA may include information about a command CMD and an address ADDR for controlling an operation of the semiconductor memory device 40. The plurality of signal lines 30 may further include data strobe signal (DQS) lines for transmitting a DQS signal.

The semiconductor memory device 40 may be the semiconductor memory device 100 of FIG. 1 according to an example embodiment. For example, in the first operation mode in which the CA signal CA is received at a relatively high speed, the semiconductor memory device 40 may generate a single output CA signal using a single input CA signal. For example, in the second operation mode in which the CA signal CA is received at a relatively slow speed, the semiconductor memory device 40 may generate a single output CA signal by multiplexing or combining two or more input CA signals.

Figure 3:
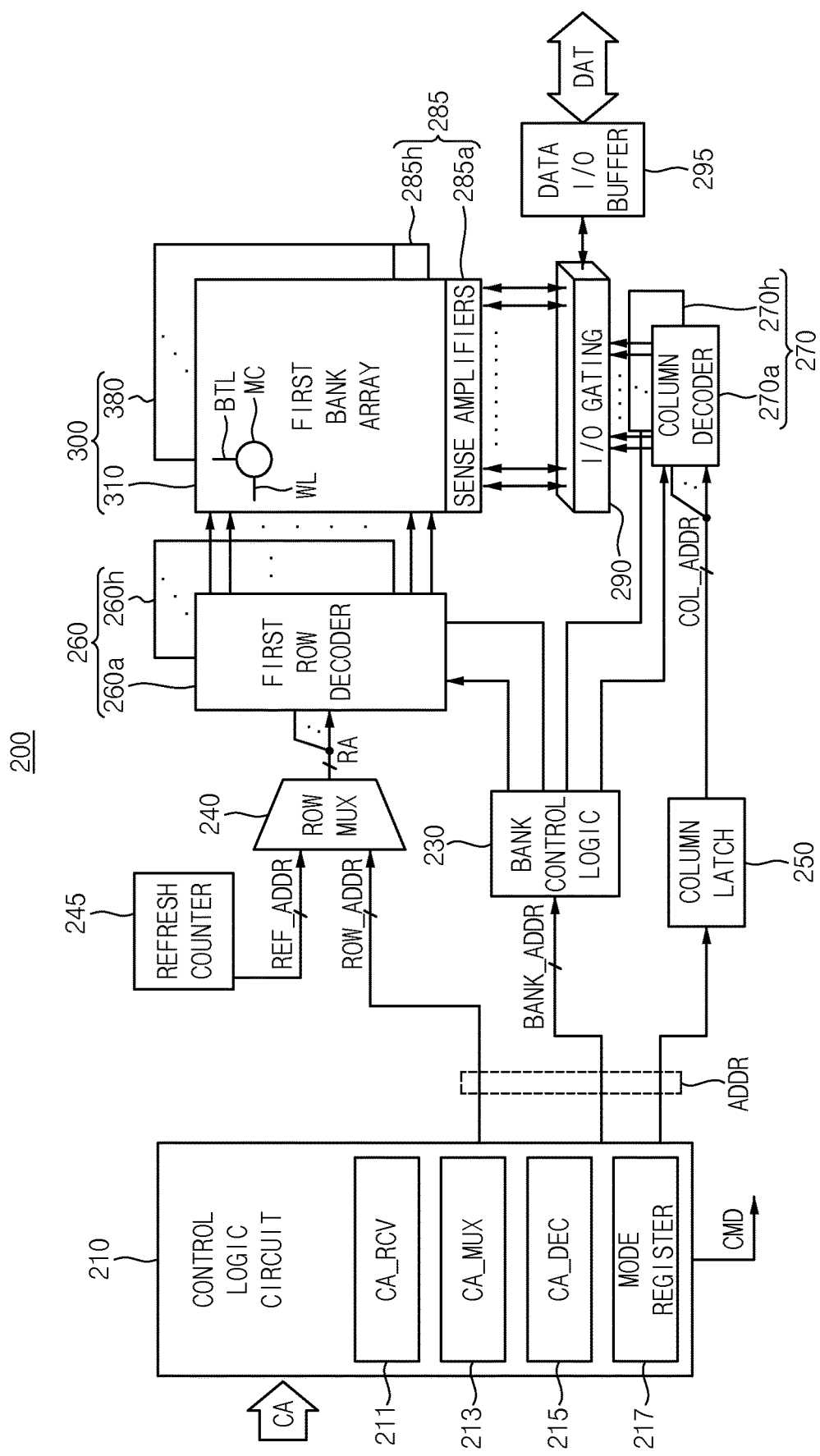
FIG. 3 is a block diagram illustrating an example of a semiconductor memory device according to an example embodiment.

FIG. 3 is a block diagram illustrating an example of a semiconductor memory device according to an example embodiment.

Referring to FIG. 3, a semiconductor memory device 200 includes a control logic circuit 210, a bank control logic circuit 230, a row address multiplexer 240, a refresh counter 245 (e.g., a counter circuit), a column address latch 250 (e.g., a latch circuit), a row decoder 260 (e.g., a decoder circuit), a column decoder 270 (e.g., a decoder circuit), a memory cell array 300, a sense amplifier unit 285 (e.g., a sense amplifier), an input/output (I/O) gating circuit 290 and a data I/O buffer 295 (e.g., a buffer circuit). For example, the semiconductor memory device 200 may be a dynamic random access memory (DRAM). The semiconductor device 200 may be used to implement memory device 40.

The memory cell array 300 may include first to eighth bank arrays 310 to 380 (e.g., first to eighth bank arrays 310, 320, 330, 340, 350, 360, 370 and 380). While eight bank arrays 310 to 380 are illustrated, the disclosure is not limited thereto as fewer or additional bank arrays may be present. The row decoder 260 may include first to eighth bank row decoders 260a to 260h connected to the first to eighth bank arrays 310 to 380, respectively. While eight bank row decoders 260a to 260h are illustrated, the disclosure is not limited thereto as fewer or additional bank row decoders may be present. The column decoder 270 may include first to eighth bank column decoders 270a to 270h connected to the first to eighth bank arrays 310 to 380, respectively. While eight bank columns decoders 270a to 270h are illustrated, the disclosure is not limited thereto as fewer or additional bank column decoders may be present. The sense amplifier unit 285 may include first to eighth bank sense amplifiers 285a to 285h connected to the first to eighth bank arrays 310 to 380, respectively. While eight sense amplifiers 285a to 285h are illustrated, the disclosure is not limited thereto as fewer or additional sense amplifiers may be present.

The first to eighth bank arrays 310 to 380, the first to eighth bank row decoders 260a to 260h, the first to eighth bank column decoders 270a to 270h, and the first to eighth bank sense amplifiers 285a to 285h may form first to eighth banks. Each of the first to eighth bank arrays 310 to 380 may include a plurality of wordlines WL, a plurality of bitlines BTL, and a plurality of memory cells MC formed at intersections of the wordlines WL and the bitlines BTL.

Although FIG. 3 illustrates the semiconductor memory device 200 including eight banks, the semiconductor memory device 200 may include any number of banks; for example, one, two, four, eight, sixteen, or thirty two banks, or any number therebetween one and thirty two.

The control logic circuit 210 may control an operation of the semiconductor memory device 200. For example, the control logic circuit 210 may generate a command CMD, an address ADDR, a control signal, and the like, based on (e.g., by decoding) a command/address (CA) signal CA received from a memory controller (e.g., the memory controller 20 in FIG. 2), such that the semiconductor memory device 200 performs a write operation or a read operation based on the command CMD, the address ADDR, the control signal, and the like. For example, the control logic circuit 210 may include a receiving circuit (CA_RCV) 211, a multiplexing circuit (CA MUX) 213 and a decoding circuit (CA_DEC) 215 for receiving and decoding the CA signal CA. For example, the control logic circuit 210 may include a mode register 217 for setting an operation mode of the semiconductor memory device 200 based on the command CMD and/or the control signal. For example, the command CMD, the address ADDR, the control signal, and the like, may be generated by decoding at least one of the CA signal CA, a write enable signal, a row address strobe signal, a column address strobe signal, a chip select signal, etc. For example, the address ADDR may include a bank address BANK_ADDR, a row address ROW_ADDR and a column address COL_ADDR.

The memory cell array 300 may correspond to the memory cell array 140 in FIG. 1. The receiving circuit 211, the multiplexing circuit 213 and the decoding circuit 215 may correspond to the receiving circuit 110, the multiplexing circuit 120 and the decoding circuit 130 in FIG. 1, respectively. In the first operation mode in which the CA signal CA is received at a relatively high speed, the receiving circuit 211, the multiplexing circuit 213 and the decoding circuit 215 may generate a single output CA signal using a single input CA signal. In the second operation mode in which the CA signal CA is received at a relatively slow speed, the receiving circuit 211, the multiplexing circuit 213 and the decoding circuit 215 may generate a single output CA signal by multiplexing or combining two or more input CA signals.

The bank control logic circuit 230 may generate bank control signals in response to the bank address BANK_ADDR received from the control logic circuit 210. One of the first to eighth bank row decoders 260a to 260h corresponding to the bank address BANK_ADDR may be activated in response to the bank control signals, and one of the first to eighth bank column decoders 270a to 270h corresponding to the bank address BANK_ADDR may be activated in response to the bank control signals.

The row address multiplexer 240 may receive the row address ROW_ADDR from the control logic circuit 210, and may receive a refresh row address REF_ADDR from the refresh counter 245. The row address multiplexer 240 may selectively output the row address ROW_ADDR or the refresh row address REF_ADDR as a row address RA. The row address RA that is output from the row address multiplexer 240 may be applied to the first to eighth bank row decoders 260a to 260h.

The activated one of the first to eighth bank row decoders 260a to 260h may decode the row address RA that is output from the row address multiplexer 240, and may activate a wordline WL corresponding to the row address RA. For example, the activated bank row decoder may generate a wordline driving voltage, and may apply the wordline driving voltage to the wordline WL corresponding to the row address RA.

The column address latch 250 may receive the column address COL_ADDR from the control logic circuit 210, and may temporarily store the received column address COL_ADDR. In an example embodiment, in a burst mode performing a burst operation, the column address latch 250 may generate column addresses that increment from the received column address COL_ADDR. The column address latch 250 may apply the temporarily stored or generated column address to the first to eighth bank column decoders 270a to 270h.

The activated one of the first to eighth bank column decoders 270a to 270h may decode the column address COL_ADDR that is output from the column address latch 250, and may control the I/O gating circuit 290 to output data corresponding to the column address COL_ADDR.

The I/O gating circuit 290 may include circuitry for gating input/output data. The I/O gating circuit 290 may further include read data latches for storing data that is output from the first to eighth bank arrays 310 to 380, and may also include write control devices for writing data to the first to eighth bank arrays 310 to 380.

Data DAT read from one of the first to eighth bank arrays 310 to 380 may be sensed by a sense amplifier connected to the one bank array from which the data DAT is to be read, and may be stored in the read data latches. The data DAT stored in the read data latches may be provided to the memory controller via the data I/O buffer 295.

Data DAT to be written in one of the first to eighth bank arrays 310 to 380 may be provided from the memory controller via the data I/O buffer 295. The received data DAT may be provided to the I/O gating circuit 290, and the I/O gating circuit 290 may write the data DAT in a sub-page of a target page in one bank array through the write drivers.

The data I/O buffer 295 may receive the data DAT from the memory controller and may provide the received data DAT to the I/O gating circuit 290 in a write operation of the semiconductor memory device 200, and may provide the data DAT from the I/O gating circuit 290 to the memory controller in a read operation of the semiconductor memory device 200.

FIG. 4 is a block diagram illustrating an example of a semiconductor memory device according to one or more embodiments.

Referring to FIG. 4, an example where two output CA signals (e.g., OCA_A and OCA_B) are generated based on the two input CA signals and one CA signal group includes four sub-CA signals, e.g., an example where N=2 and M=4 in FIG. 1, is illustrated. For convenience of illustration, a component corresponding to the memory cell array 140 in FIG. 1 is omitted.

As illustrated in FIG. 4, a semiconductor memory device 100a may include first CA pins 101, second CA pins 103, a first CA buffer 111, a second CA buffer 113, a first multiplexer 121, a second multiplexer 123, a first CA decoder 131 and a second CA decoder 133. The memory device 100a may be used to implement the memory device 40. The first and second CA buffers 111 and 113 may be included in the receiving circuit 110 of FIG. 1, the first and second multiplexers 121 and 123 may be included in the multiplexing circuit 120 of FIG. 1, and the first and second CA decoders 131 and 133 may be included in the decoding circuit 130 of FIG. 1.

The first CA pins 101 may receive a first input CA signal ICA_A. The second CA pins 103 may receive the second input CA signal ICA_B. For example, a pin may be a contact pad or a contact pin, but example embodiments are not limited thereto.

The first CA buffer 111 may generate a first CA signal group CA_G_A, which includes first sub-CA signals CA_0_A, CA_1_A, CA_2_A and CA_3_A, based on the clock signal CK and the first input CA signal ICA_A. The second CA buffer 113 may generate a second CA signal group CA_G_B, which includes second sub-CA signals CA_0_B, CA_1_B, CA_2_B and CA_3_B, based on the clock signal CK and the second input CA signal ICA_B. For example, the first and second CA buffers 111 and 113 may generate the first and second CA signal groups CA_G_A and CA_G_B by parallelizing or demultiplexing the first and second input CA signals ICA_A and ICA_B, respectively.

The first multiplexer 121 may receive a first set of sub-CA signals CA_1_A and CA_3_A of the first CA signal group CA_G_A and a first set of sub-CA signals CA_1_B and CA_3_B of the second CA signal group CA_G_B. Based on the mode selection signal SEL, the first multiplexer 121 may selectively output selected CA signals CA_1_S and CA_3_S. For example, the first multiplexer 121 may select one of the sub-CA signal CA_1_A and the sub-CA signal CA_1_B, and one of the sub-CA signal CA_3_A and the sub-CA signal CA_3_B. The first multiplexer 121 may output the selected sub-CA signal CA_1_S, which is selected from among one of the sub-CA signal CA_1_A and the sub-CA signal CA_1_B, and output the selected sub-CA signal CA_3_S, which is selected from among one of the sub-CA signal CA_3_A and the sub-CA signal CA_3_B. The selected sub-CA signals CA_1_S and CA_3_S may be output to the first CA decoder 131. In addition, a second set of sub-CA signals CA_0_A and CA_2_A of the first CA signal group CA_G_A may be output from the first CA buffer 111 to the first CA decoder 131. The selected CA signals CA_1_S and CA_3_S and the second set of sub-CA signals CA_0_A and CA_2_A of the first CA signal group CA_G_A may be collectively referred to as the first selected CA signal group CA_S_A.

The second multiplexer 123 may receive the second set of sub-CA signals CA_0_A and CA_2_A of the first CA signal group CA_G_A and a second set of sub-CA signals CA_0_B and CA_2_B of the second CA signal group CA_G_B. Based on the mode selection signal SEL, the second multiplexer 123 may selectively output selected sub-CA signals CA_0_S and CA_2_S. For example, the second multiplexer 123 may select one of the sub-CA signal CA_0_A and the sub-CA signal CA_0_B, and one of the sub-CA signal CA_2_A and the sub-CA signal CA_2_B. The second multiplexer 123 may output the selected sub-CA signal CA_0_S, which is selected from among one of the sub-CA signal CA_0_A and the sub-CA signal CA_0_B, and output the selected sub-CA signal CA_2_S, which is selected from among one of the sub-CA signal CA_2_A and the sub-CA signal CA_2_B. The selected sub-CA signals CA_0_S and CA_2_S may be output to the second decoder 133. In addition, the first set of sub-CA signals CA_1_B and CA_3_B of the second CA signal group CA_G_B may be output from the second CA buffer 113 to the second decoder 133. The selected sub-CA signals CA_0_S and CA_2_S, and the first set of sub-CA signals CA_1_B and CA_3_B of the second CA signal group CA_G_B may be collectively referred to as the second selected CA signal group CA_S_B.

The first CA decoder 131 may generate a first output CA signal OCA_A based on the first selected CA signal group CA_S_A (e.g., based on the CA signals CA_0_A, CA_1_S, CA_2_A and CA_3_S). The second CA decoder 133 may generate a second output CA signal OCA_B based on the second selected CA signal group CA_G_B (e.g., based on the CA signals CA_0_S, CA_1_B, CA_2_S and CA_3_B).

FIGS. 5A, 5B, 6A and 6B are diagrams for describing an operation of a semiconductor memory device of FIG. 4.

Referring to FIGS. 5A and 5B, an operation of the semiconductor memory device 100a in the first operation mode is illustrated. For example, when the mode selection signal SEL has a first logic level (e.g., '0', which is a logic low level), the semiconductor memory device 100a may operate in the first operation mode.

In the first operation mode, the first multiplexer 121 may select the first parts CA_1_A and CA_3_A of the first CA signal group CA_G_A, and may output the first parts CA_1_A and CA_3_A of the first CA signal group CA_G_A as the first part CA_1_S and CA_3_S of the first selected CA signal group CA_S_A. Thus, the first selected CA signal group CA_S_A may be substantially the same as the first CA signal group CA_G_A, and may include the first sub-CA signals CA_0_A, CA_1_A, CA_2_A and CA_3_A. For example, the first decoder 131 may receive CA_1_A and CA_3_A from the first multiplexer 121 and CA_0_A and CA_2_A from the first buffer 111.

In addition, the second multiplexer 123 may select the second set of sub-CA signals CA_0_B and CA_2_B of the second CA signal group CA_G_B, and may output the second set of sub-CA signals CA_0_B and CA_2_B of the second CA signal group CA_G_B as the selected sub-CA signals CA_0_S and CA_2_S to the second CA decoder 133. Thus, the second selected CA signal group CA_S_B may be the same as the second CA signal group CA_G_B, and may include the second sub-CA signals CA_0_B, CA_1_B, CA_2_B and CA_3_B. For example, the second decoder 133 may receive the second set of sub-CA signals CA_0_B and CA_2_B from the second multiplexer 123 and the first set of sub-CA signals CA_1_B and CA_3_B from the second buffer 113.

For example, as illustrated in FIG. 5B, the first and second input CA signals ICA_A and ICA_B may be received at a first rate (or first signal rate or first frequency). The first input CA signal ICA_A may include values a01, a11, a21 and a31, and the second input CA signal ICA_B may include values b01, b11, b21 and b31. For example, the values a01, a11, a21, a31, b01, b11, b21 and b31 may be commands and addresses.

According to one or more embodiments, at time t01, the first CA buffer 111 may generate the first sub-CA signal CA_0_A by obtaining (e.g., latching) the value a01 of the first input CA signal ICA_A based on the clock signal CK, and the second command/address buffer 113 may generate the second sub-CA signal CA_0_B by obtaining (e.g., latching) the value b01 of the second input CA signal ICA_B based on the clock signal CK. Similarly, at time t11, the first and second CA buffers 111 and 113 may generate first and second sub-CA signals CA_1_A and CA_1_B, respectively, by obtaining the values a11 and b11 of the first and second input CA signals ICA_A and ICA_B based on the clock signal CK, respectively. At time t21, the first and second CA buffers 111 and 113 may generate first and second sub-CA signals CA_2_A and CA_2_B, respectively, by obtaining the values a21 and b21 of the first and second input CA signals ICA_A and ICA_B based on the clock signal CK, respectively. At time t31, the first and second CA buffers 111 and 113 may generate first and second sub-CA signals CA_3_A and CA_3_B, respectively, by obtaining the values a31 and b31 of the first and second input CA signals ICA_A and ICA_B based on the clock signal CK, respectively. For example, values a01 and b01 may be latched as sub-signals CA_0_A and CA_0_B, respectively at a first rising edge of the clock signal CK, values a11 and b11 may be latched as sub-signals CA_1_A and CA_1_B, respectively at a second rising edge of the clock signal CK, etc.

Thereafter, as described above, the first set of sub-CA signals CA_1_A and CA_3_A of the first CA signal group CA_G_A may be selected as the first selected sub-CA signals CA_1_S and CA_3_S of the first selected CA signal group CA_S_A, and the second set of sub-CA signals CA_0_B and CA_2_B of the second CA signal group CA_G_B may be selected as the second selected sub-CA signals CA_0_S and CA_2_S of the second selected CA signal group CA_S_B. Thus, at time t41, the first sub-CA signals CA_0_A, CA_1_A, CA_2_A and CA_3_A having the values a01, a11, a21 and a31 may be provided to the first CA decoder 131 as the first selected CA signal group CA_S_A, and the second sub-CA signals CA_0_B, CA_1_B, CA_2_B and CA_3_B having the values b01, b11, b21 and b31 may be provided to the second CA decoder 132 as the second selected CA signal group CA_S_B.

The first CA decoder 131 may generate the first output CA signal OCA_A based on the first selected CA signal group CA_S_A (e.g., based on the first sub-CA signals CA_0_A, CA_1_A, CA_2_A and CA_3_A having the values a01, a11, a21 and a31).

In addition, the second CA decoder 133 may generate the second output CA signal OCA_B based on the second selected CA signal group CA_S_B (e.g., based on the second sub-CA signals CA_0_B, CA_1_B, CA_2_B and CA_3_B having the values b01, b11, b21 and b31).

As a result, in the first operation mode, the first output CA signal OCA_A may be generated using only the first input CA signal ICA_A received through the first CA pins 101, and the second output CA signal OCA_B may be generated using only the second input CA signal ICA_B received through the second CA pins 103.

Figure 6B:
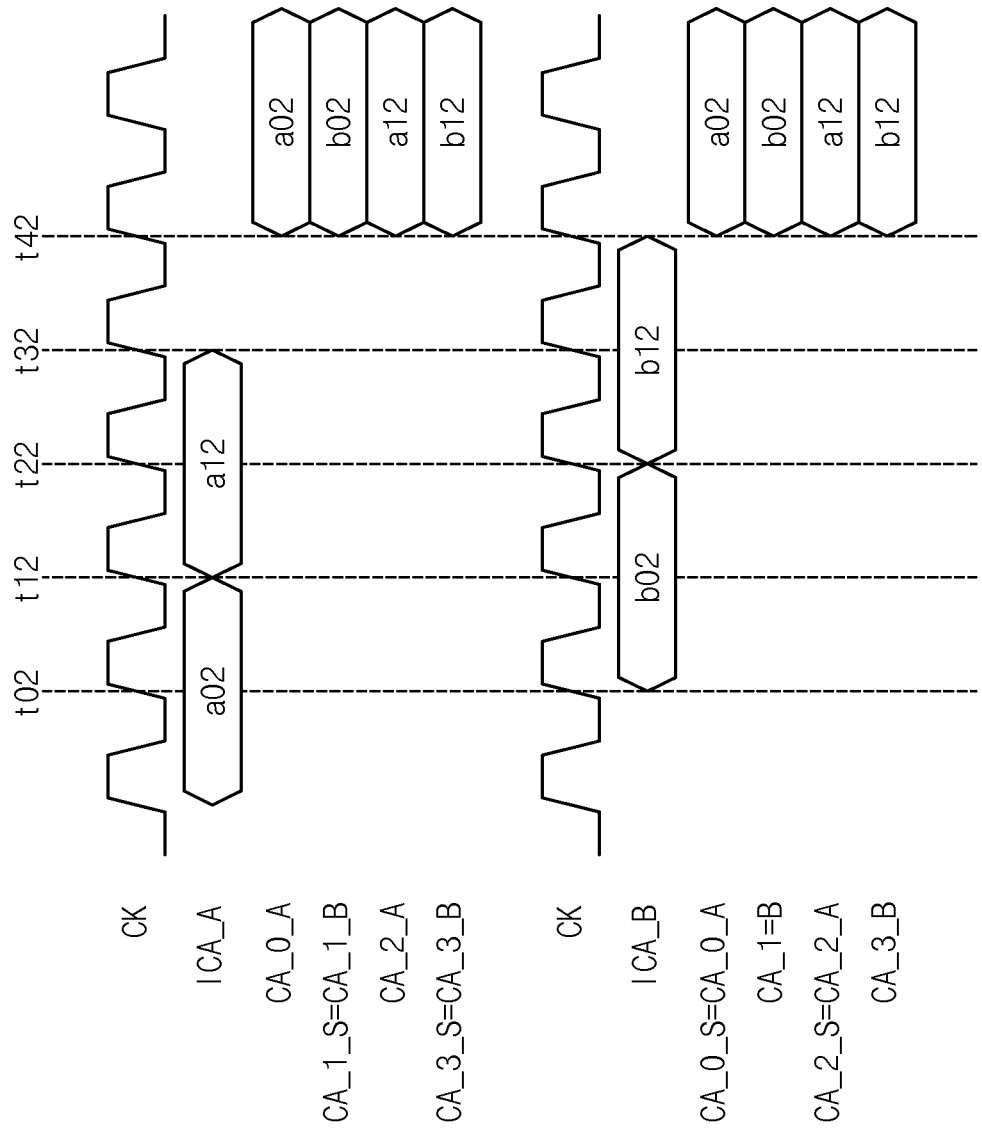

Referring to FIGS. 6A and 6B, an operation of the semiconductor memory device 100a in the second operation mode is illustrated. For example, when the mode selection signal SEL has a second logic level (e.g., '1', which is a logic high level) different from the first logic level, the semiconductor memory device 100a may operate in the second operation mode.

In the second operation mode, the first multiplexer 121 may select the first set of sub-CA signals CA_1_B and CA_3_B of the second CA signal group CA_G_B, and may output the first set of sub-CA signals CA_1_B and CA_3_B of the second CA signal group CA_G_B as the first selected sub-CA signals CA_1_S and CA_3_S of the first selected CA signal group CA_S_A. Thus, the first selected CA signal group CA_S_A may be obtained by combining the second set of sub-CA signals CA_0_A and CA_2_A of the first CA signal group CA_G_A and the first set of sub-CA signals CA_1_B and CA_3_B of the second CA signal group CA_G_B, and may include the first sub-CA signals CA_0_A and CA_2_A and the second sub-CA signals CA_1_B and CA_3_B.

In addition, the second multiplexer 123 may select the second set of sub-CA signals CA_0_A and CA_2_A of the first CA signal group CA_G_A, and may output the second set of sub-CA signals CA_0_A and CA_2_A of the first CA signal group CA_G_A as the first selected sub-CA signals CA_0_S and CA_2_S of the second selected CA signal group CA_S_B. Thus, as with the first selected CA signal group CA_S_A, the second selected CA signal group CA_S_B may be obtained by combining the second set of sub-CA signals CA_0_A and CA_2_A of the first CA signal group CA_G_A and the first set of sub-CA signals CA_1_B and CA_3_B of the second CA signal group CA_G_B, and may include the first sub-CA signals CA_0_A and CA_2_A and the second sub-CA signals CA_1_B and CA_3_B.

For example, as illustrated in FIG. 6B, the first and second input CA signals ICA_A and ICA_B may be received at a second rate slower than the first rate in FIG. 5B. For example, the second rate may be about a half of the first rate, and the second operation mode may be referred to as a half-speed mode (or a half-rate mode). The first input CA signal ICA_A may include values a02 and a12, and the second input CA signal ICA_B may include values b02 and b12.

At time t02, the first CA buffer 111 may generate the first sub-CA signal CA_0_A by obtaining (e.g., latching) the value a02 of the first input CA signal ICA_A based on the clock signal CK. At time t12, the second CA buffer 113 may generate the second sub-CA signal CA_1_B by obtaining the value b02 of the second input CA signal ICA_B based on the clock signal CK. Similarly, at time t22, the first CA buffer 111 may generate the first sub-CA signal CA_2_A by obtaining the value a12 of the first input CA signal ICA_A based on the clock signal CK. At time t32, the second CA buffer 113 may generate the second sub-CA signal CA_2_B by obtaining the value b12 of the second input CA signal ICA_B based on the clock signal CK.

Thereafter, as described above, the second set of sub-CA signals CA_1_B and CA_3_B of the second CA signal group CA_G_B may be selected as the first selected sub-CA signals CA_1_S and CA_3_S of the first selected CA signal group CA_S_A, and the first set of sub-CA signals CA_0_A and CA_2_A of the first CA signal group CA_G_A may be selected as the first selected sub-CA signals CA_0_S and CA_2_S of the second selected CA signal group CA_S_B. Thus, at time t42, the first set of sub-CA signals CA_0_A and CA_2_A having the values a02 and a12 and the second set of sub-CA signals CA_1_B and CA_3_B having the values b02 and b12 may be provided to the first and second CA decoders 131 and 133 as the first and second selected CA signal groups CA_S_A and CA_S_B.

The first CA decoder 131 may generate the first output CA signal OCA_A based on the first selected CA signal group CA_S_A (e.g., based on the first sub-CA signals CA_0_A and CA_2_A having the values a02 and a12 and the second sub-CA signals CA_1_B and CA_3_B having the values b02 and b12). For example, the first CA decoder 131 may receive CA_0_A and CA_2_A from the first buffer 111 and receive CA_1_B and CA_3_B from the first multiplexer 111.

Similarly, the second CA decoder 133 may generate the second output CA signal OCA_B based on the second selected CA signal group CA_S_B (e.g., based on the first sub-CA signals CA_0_A and CA_2_A having the values a02 and a12 and the second sub-CA signals CA_1_B and CA_3_B having the values b02 and b12). For example, the second CA decoder 133 may receive CA_1_B and CA_3_B from the second buffer 113 and receive CA_0_A and CA_2_A from the second multiplexer 113.

As a result, in the second operation mode, the first and second output CA signals OCA_A and OCA_B may be generated using both the first input CA signal ICA_A received through the first CA pins 101 and the second input CA signal ICA_B received through the second CA pins 103 (e.g., by multiplexing the first and second CA pins 101 and 103 and by multiplexing the first and second input CA signals ICA_A and ICA_B).

In an example embodiment, the first CA decoder 131 may generate the first output CA signal OCA_A using only the values a02 and a12 corresponding to the first input CA signal ICA_A, among the values a02, a12, b02 and b12 included in the first selected CA signal group CA_S_A. Similarly, the second CA decoder 133 may generate the second output CA signal OCA_B using only the values b02 and b12 corresponding to the second input CA signal ICA_B, among the values a02, a12, b02 and b12 included in the second selected CA signal group CA_S_B.

Although example embodiments are described based on the example where the CA signals CA_0_A, CA_1_A, CA_2_A and CA_3_A are defined as the first sub-CA signals and the CA signals CA_0_B, CA_1_B, CA_2_B and CA_3_B are defined as the second sub-CA signals, the disclosure is not limited thereto. For example, the CA signals CA_0_A, CA_1_A, CA_2_A and CA_3_A may be defined as first to X-th sub-CA signals, and the CA signals CA_0_B, CA_1_B, CA_2_B and CA_3_B may be defined as (X+1)-th to 2X-th sub-CA signals, where X is an even number greater than or equal to two. In the example of FIG. 4, X=4. For example, the CA signals CA_1_A and CA_3_A may be defined as the first to X/2-th sub-CA signals, the CA signals CA_0_A and CA_2_A may be defined as the (X/2+1)-th to X-th sub-CA signals, the CA signals CA_1_B and CA_3_B may be defined as the (X+1)-th to 3X/2-th sub-CA signals, and the CA signals CA_0_B and CA_2_B may be defined as the (3X/2+1)-th to 2X-th sub-CA signals. In addition, the CA signals CA_1_S and CA_3_S may be defined as first to X/2-th selected CA signals, and the CA signals CA_0_S and CA_2_S may be defined as (X/2+1)-th to X-th selected CA signals.

In this example, the first multiplexer 121 may output the first to X/2-th sub-CA signals CA_1_A and CA_3_A as the first to X/2-th selected CA signals CA_1_S and CA_3_S in the first operation mode, and may output the (X+1)-th to 3X/2-th sub-CA signals CA_1_B and CA_3_B as the first to X/2-th selected CA signals CA_1_S and CA_3_S in the second operation mode. The second multiplexer 123 may output the (3X/2+1)-th to 2X-th sub-CA signals CA_0_B and CA_2_B as the (X/2+1)-th to X-th selected CA signals CA_0_S and CA_2_S in the first operation mode, and may output the (X/2+1)-th to X-th sub-CA signals CA_0_A and CA_2_A as the (X/2+1)-th to X-th selected CA signals CA_0_S and CA_2_S in the second operation mode. The first CA decoder 131 may generate the first output CA signal OCA_A based on the first to X/2-th selected CA signals CA_1_S and CA_3_S and the (X/2+1)-th to X-th sub-CA signals CA_0_A and CA_2_A. The second CA decoder 133 may generate the second output CA signal OCA_B based on the (X/2+1)-th to X-th selected CA signals CA_0_S and CA_2_S and the (X+1)-th to 3X/2-th sub-CA signals CA_1_B and CA_3_B.

FIG. 7 is a block diagram illustrating a semiconductor memory device according to example embodiments. The descriptions of FIG. 1 may be applied to FIG. 7 and thus will be omitted.

Referring to FIG. 7, a semiconductor memory device 102 includes a receiving circuit 112, a multiplexing circuit 120, a decoding circuit 130, a memory cell array 140 and a clock generating circuit 150.

The semiconductor memory device 102 may be substantially the same as the semiconductor memory device 100 of FIG. 1, except that the semiconductor memory device 102 further includes the clock generating circuit 150 and an operation of the receiving circuit 112 is partially changed. For example, the semiconductor memory device 102 may be used to implement the semiconductor memory device 40.

The clock generating circuit 150 may generate a plurality of driving clock signals DCK based on the clock signal CK. For example, the clock generating circuit 150 may include at least one clock divider. For example, the clock divider may be implemented by a circuit such as frequency divider, a scaler, or a prescaler.

The receiving circuit 112 may generate the plurality of CA signal groups CA_G_1 to CA_G_N based on the plurality of driving clock signals DCK and the plurality of input CA signals ICA_1 to ICA_N.

Figure 8:
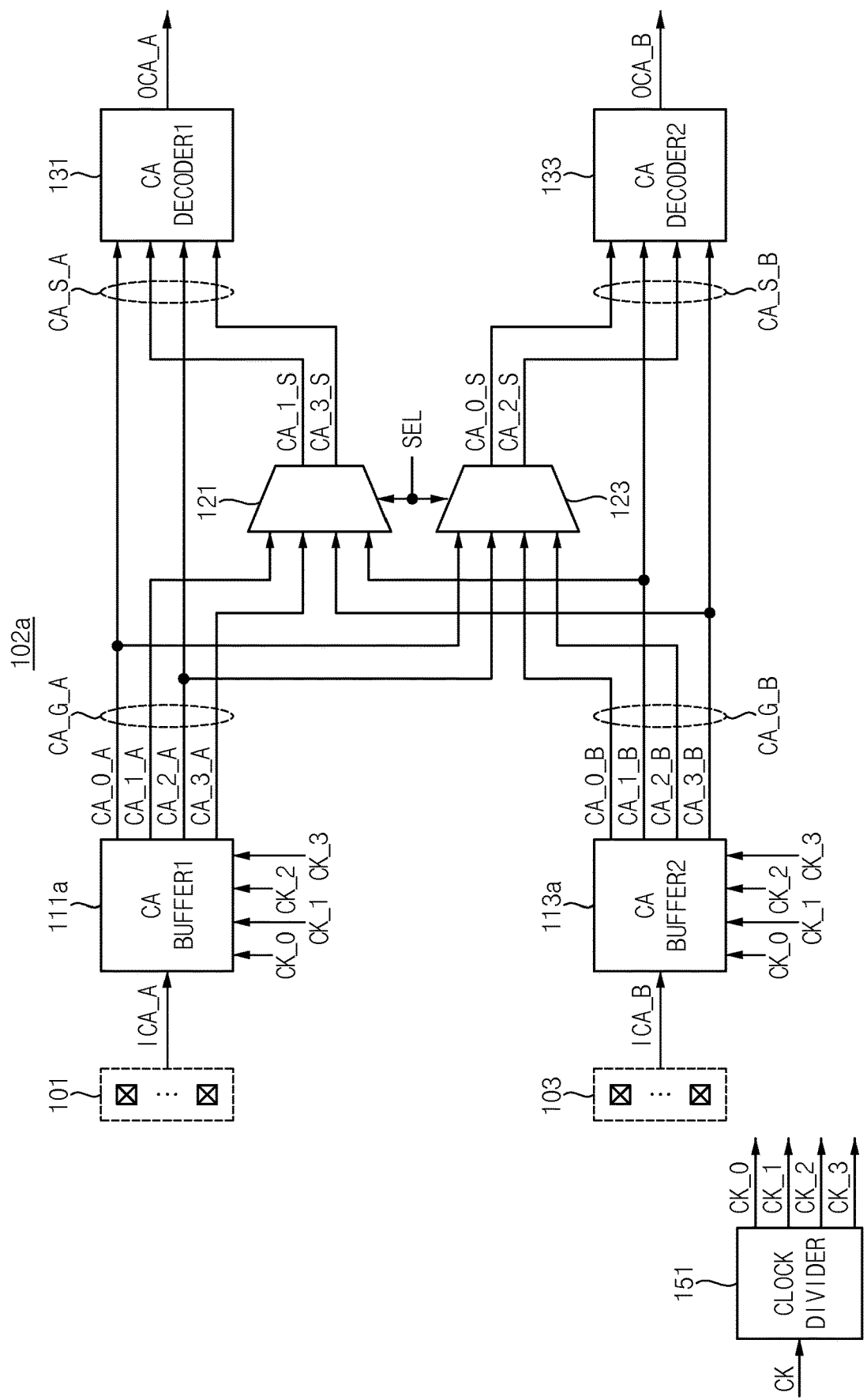
FIGS. 8 and 9 are block diagrams illustrating examples of a semiconductor memory device of FIG. 7.
Figure 9:
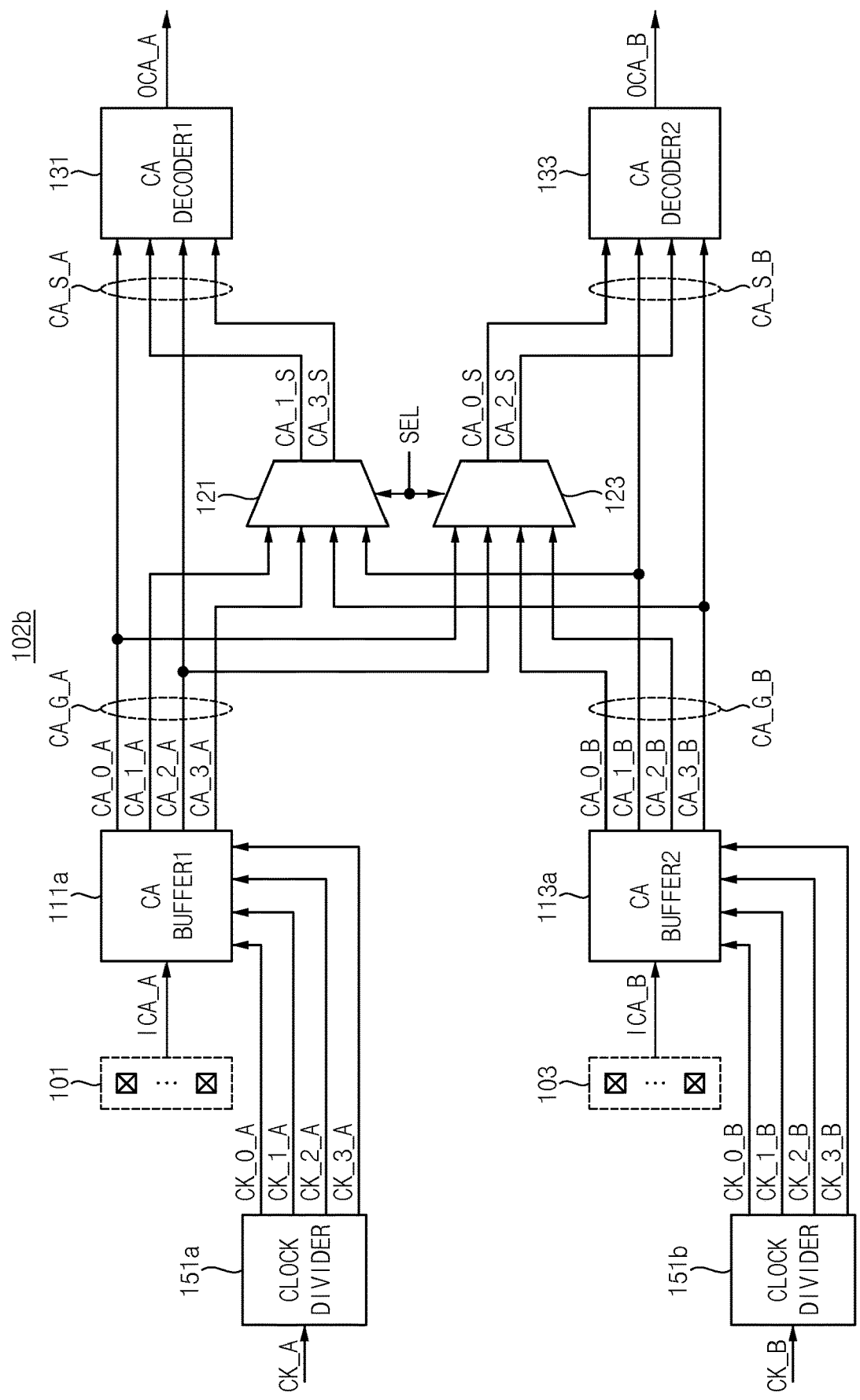

FIGS. 8 and 9 are block diagrams illustrating examples of a semiconductor memory device of FIG. 7. The descriptions of FIG. 4 may be applied to FIGS. 8 and 9 and this will be omitted.

Referring to FIG. 8, a semiconductor memory device 102a may include first CA pins 101, second CA pins 103, a first CA buffer 111a, a second CA buffer 113a, a first multiplexer 121, a second multiplexer 123, a first CA decoder 131, a second CA decoder 133 and a clock divider 151. The clock divider 151 may be included in the clock generating circuit 150 of FIG. 7.

The semiconductor memory device 102a may be substantially the same as the semiconductor memory device 100a of FIG. 4, except that the semiconductor memory device 102a further includes the clock divider 151 and operations of the first and second CA buffers 111a and 113a are partially changed as compared to the first and second CA buffers 111 and 113.

The clock divider 151 may generate common driving clock signals CK_0, CK_1, CK_2 and CK_3 based on the clock signal CK. For example, among the common driving clock signals CK_0 to CK_3, two adjacent common driving clock signals may partially overlap in phase.

The first and second CA buffers 111a and 113a may operate based on the common driving clock signals CK_0 to CK_3. The first CA buffer 111a may generate the first CA signal group CA_G_A based on the common driving clock signals CK_0 to CK_3 and the first input CA signal ICA_A. The second CA buffer 113a may generate the second CA signal group CA_G_B based on the common driving clock signals CK_0 to CK_3 and the second input CA signal ICA_B. For example, the first and second sub-CA signals CA_0_A and CA_0_B may be generated based on the common driving clock signal CK_0, the first and second sub-CA signals CA_1_A and CA_1_B may be generated based on the common driving clock signal CK_1, the first and second sub-CA signals CA_2_A and CA_2_B may be generated based on the common driving clock signal CK_2, and the first and second sub-CA signals CA_3_A and CA_3_B may be generated based on the common driving clock signal CK_3.

Referring to FIG. 9, a semiconductor memory device 102b may include first CA pins 101, second CA pins 103, a first CA buffer 111a, a second CA buffer 113a, a first multiplexer 121, a second multiplexer 123, a first CA decoder 131, a second CA decoder 133, a first clock divider 151a and a second clock divider 151b. The first and second clock dividers 151a and 151b may be included in the clock generating circuit 150 of FIG. 7.

The semiconductor memory device 102b may be substantially the same as the semiconductor memory device 100a of FIG. 4, except that the semiconductor memory device 102b further includes the first and second clock dividers 151a and 151b and operations of the first and second CA buffers 111a and 113a are partially changed. The first and second CA buffers 111a and 113a may be substantially the same as the first and second CA buffers 111a and 113a in FIG. 8.

The first clock divider 151a may generate first driving clock signals CK_0_A, CK_1_A, CK_2_A and CK_3_A based on the first clock signal CK_A. The second clock divider 151b may generate second driving clock signals CK_0_B, CK_1_B, CK_2_B and CK_3_B based on the second clock signal CK_B. The first driving clock signals CK_0_A to CK_3_A and the second driving clock signals CK_0_B to CK_3_B may be substantially the same as the common driving clock signals CK_0 to CK_3 in FIG. 8, respectively.

The first CA buffer 111a may operate based on the first driving clock signals CK_0_A to CK_3_A, and the second CA buffer 113a may operate based on the second driving clock signals CK_0_B to CK_3_B. The first CA buffer 111a may generate the first CA signal group CA_G_A based on the first driving clock signals CK_0_A to CK_3_A and the first input CA signal ICA_A. The second CA buffer 113a may generate the second CA signal group CA_G_B based on the second driving clock signals CK_0_B to CK_3_B and the second input CA signal ICA_B.

As described with reference to FIGS. 7, 8 and 9, a combination of commands and addresses may be generated using the CA signals synchronized to two or more clock cycles.

Figure 10:
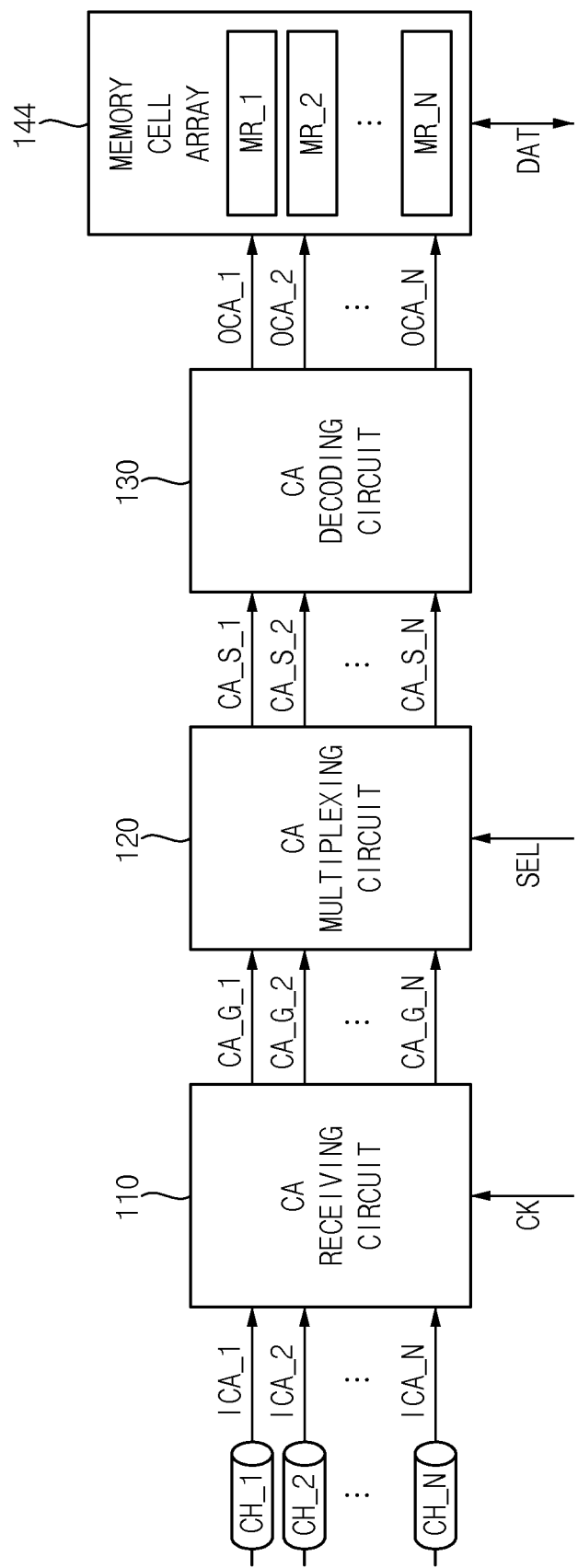
FIG. 10 is a block diagram illustrating a semiconductor memory device according to an example embodiment.

FIG. 10 is a block diagram illustrating a semiconductor memory device according to an example embodiment. The descriptions of FIG. 1 may be applied to FIG. 10 and thus will be omitted.

Referring to FIG. 10, a semiconductor memory device 104 includes a receiving circuit 110, a multiplexing circuit 120, a decoding circuit 130 and a memory cell array 144.

The semiconductor memory device 104 may be substantially the same as the semiconductor memory device 100 of FIG. 1, except that a configuration of the memory cell array 144 is partially changed as compared to memory cell array 140 and the semiconductor memory device 104 is implemented in the form of a multi-channel memory device.

The plurality of input CA signals ICA_1 to ICA_N may be received through a plurality of channels CH_1, CH_2, . . . , CH_N that are different or separate from each other. For example, the plurality of channels CH_1 to CH_N may include first through N-th channels. For example, the first input CA signal ICA_1 may be received through the first channel CH_1. The semiconductor memory device 104 may have a multi-channel structure in which independent CA signals are used in different channels.

The memory cell array 144 may include a plurality of memory regions (or areas) MR_1, MR_2, . . . , MR_N. For example, the plurality of memory regions MR_1 to MR_N may include first through N-th memory regions. Each of the first to N-th memory regions may correspond to a respective one of the first to N-th channels. For example, the first memory region MR_1 may correspond to the first channel CH_1. In other words, independent memory regions may be allocated to different channels. For example, one bank described with reference to FIG. 3 may correspond to one memory region, but example embodiments are not limited thereto.

The plurality of memory regions MR_1 to MR_N may operate independently based on the plurality of output CA signals OCA_1 to OCA_N. For example, the first memory region MR_1 corresponding to the first channel CH_1 may operate based on the first output CA signal OCA_1 that is generated based on the first input CA signal ICA_1 received through the first channel CH_1. The second memory region MR_2 corresponding to the second channel CH_2 may operate based on the second output CA signal OCA_2 that is generated based on the second input CA signal ICA_2 received through the second channel CH_2, and may operate independently of the first memory region MR_1. For example, while a write operation is performed on the first memory region MR_1, a read operation may be performed on the second memory region MR_2 simultaneously with the write operation on the first memory region MR_1. For example, the first memory region MR_1 may operate in an active state, and the second memory region MR_2 may have a standby state or a power-down state while the first memory region MR_1 operates in the active state. In an embodiment, transistors of one of the memory regions in the standby state or the power-down state receive no power or less power than transistors of one of the memory regions in the active state.

Figure 11:
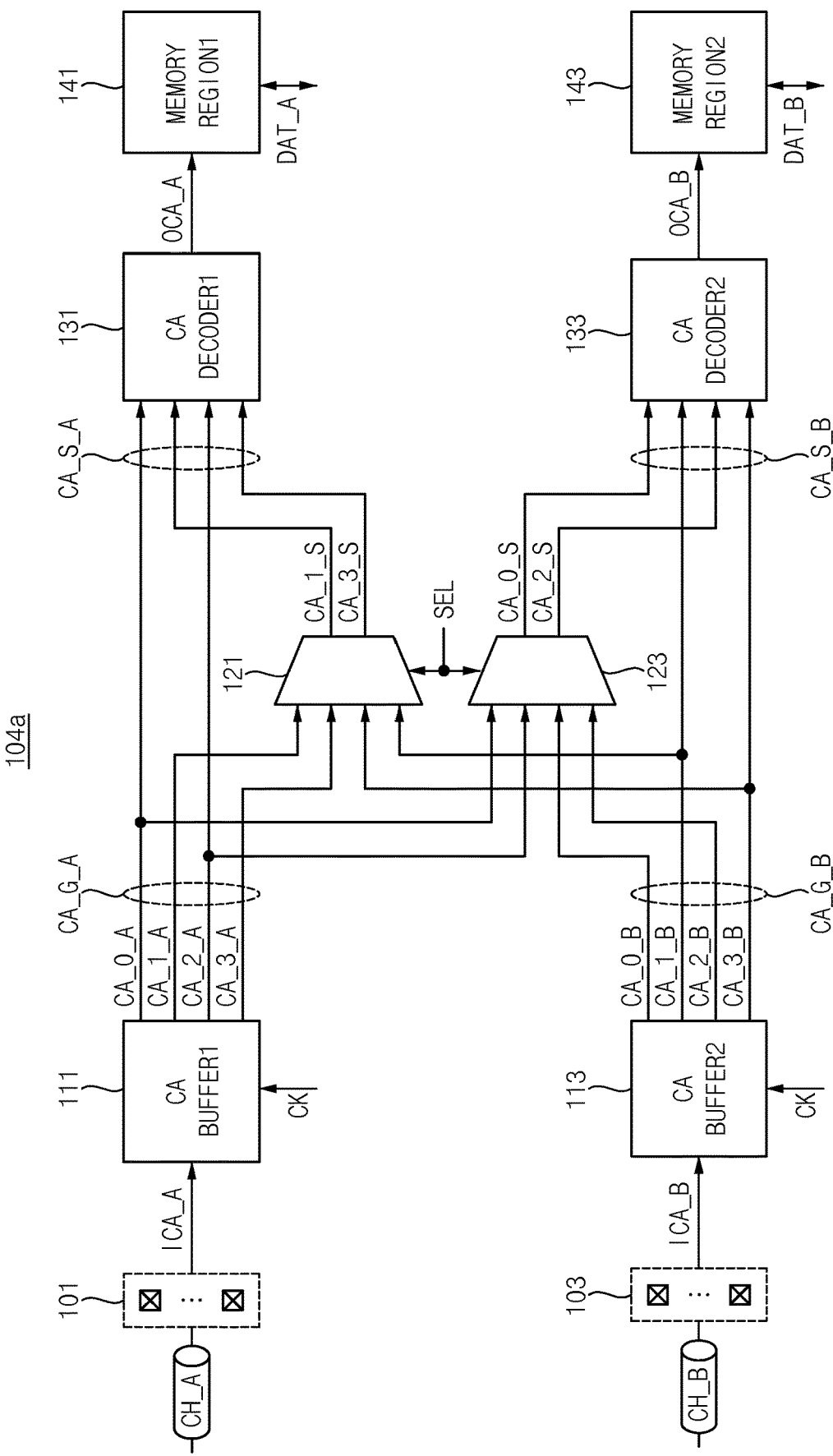
FIG. 11 is a block diagram illustrating an example of a semiconductor memory device of FIG. 10.

FIG. 11 is a block diagram illustrating an example of a semiconductor memory device of FIG. 10. The descriptions of FIG. 4 may be applied to FIG. 11 and thus will be omitted.

Referring to FIG. 11, a semiconductor memory device 104a may include first CA pins 101, second CA pins 103, a first CA buffer 111, a second CA buffer 113, a first multiplexer 121, a second multiplexer 123, a first CA decoder 131, a second CA decoder 133, a first memory region 141 and a second memory region 143. The first and second memory regions 141 and 143 may be included in the memory cell array 144 of FIG. 10.

The semiconductor memory device 104a may be substantially the same as the semiconductor memory device 100a of FIG. 4, except that the first and second CA pins 101 and 103 are connected to first and second channels CH_A and CH_B that are different from each other, respectively, and the first and second CA decoders 131 and 133 are connected to the first and second memory regions 141 and 143 that are different from each other, respectively.

The first CA pins 101 may receive the first input CA signal ICA_A through the first channel CH_A, and the second CA pins 103 may receive the second input CA signal ICA_B through the second channel CH_B.

The first memory region 141 corresponding to the first channel CH_A may store first data DAT_A or output stored first data DAT_A based on the first output CA signal OCA_A. The second memory region 143 corresponding to the second channel CH_B may store second data DAT_B or output stored second data DAT_B based on the second output CA signal OCA_B. The second memory region 143 may operate independently of the first memory region 141.

As described with reference to FIGS. 10 and 11, independent CA signals of different channels may be multiplexed, and the multiplexed CA signals may be used.

In san example embodiment, the semiconductor memory device 104 of FIG. 10 further includes the clock generating circuit 150 in FIG. 7. In some example embodiments, the semiconductor memory device 104a of FIG. 11 may further include the clock divider 151 in FIG. 8 or the first and second clock dividers 151a and 151b in FIG. 9.

Figure 12:
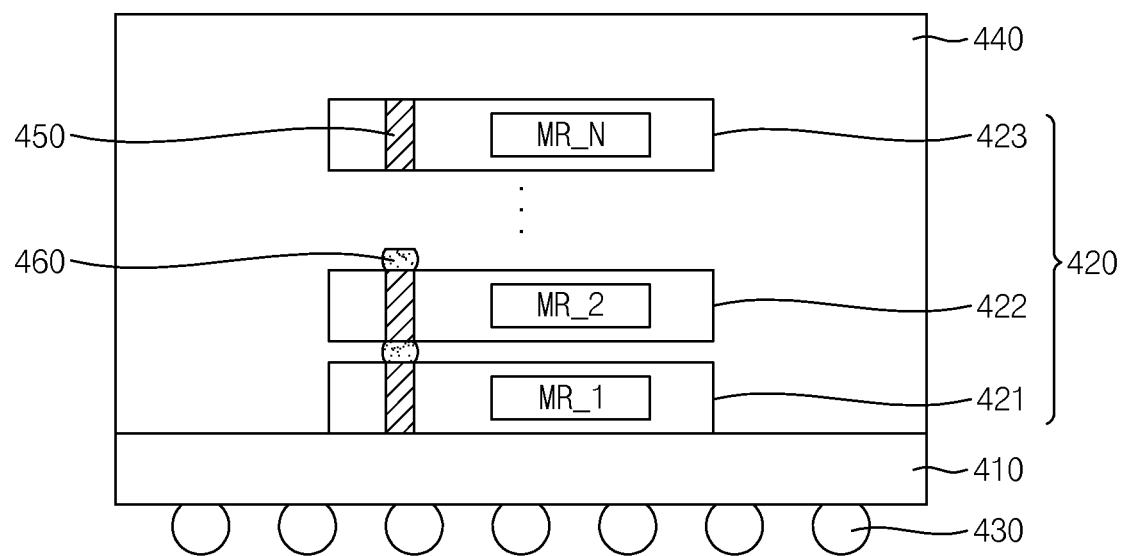
FIG. 12 is a cross-sectional view of a semiconductor memory device according to an example embodiment.

FIG. 12 is a cross-sectional view of a semiconductor memory device according to an example embodiment.

Referring to FIG. 12, a semiconductor memory device 400 may be implemented as a multi-stacked structure. The multi-stacked structure may be applied to any of the above-described semiconductor memory devices.

The semiconductor memory device 400 may include abase substrate 410 and a plurality of semiconductor dies (or semiconductor chips, memory dies or memory chips) 420 that are disposed, formed or arranged on the base substrate 410. For example, the plurality of semiconductor dies 420 may include first to N-th semiconductor dies 421, 422 and 423. The plurality of semiconductor dies 420 may be fixed by a sealing member 440, and conductive bumps 430 may be disposed on a bottom surface of the base substrate 410 for electrical connections to an external device.

Each of the plurality of semiconductor dies 420 may include a plurality of through silicon vias (TSVs) 450 that are disposed through or penetrating each semiconductor die. For example, a single TSV may be disposed through a portion of or a whole of a semiconductor substrate included in a single semiconductor die. For example, the plurality of TSVs 450 may include command/address (CA) TSVs, data input/output (I/O) TSVs, etc.

In an example embodiment, with respect to each of the plurality of semiconductor dies 420, the plurality of TSVs 450 are arranged at the same locations in each semiconductor die. As such, the plurality of semiconductor dies 420 may be stacked such that the plurality of TSVs 450 of each semiconductor die may be completely overlapped (e.g., arrangements of the plurality of TSVs 450 may be perfectly matched in the semiconductor dies 420). In such a stacked state, the plurality of semiconductor dies 420 may be electrically connected to one another and the base substrate 410 through the plurality of TSVs 450 and conductive material 460. Adhesive members and/or insulating materials may intervene between the plurality of semiconductor dies 420.

In an example embodiment, the plurality of memory regions MR_1 to MR_N in FIG. 10 are included in different semiconductor dies 420. For example, the first memory region MR_1 may be disposed in or on the first semiconductor die 421, and the second memory region MR_2 may be disposed in or on the second semiconductor die 422 stacked on the first semiconductor die 421. In the example of FIG. 12, one semiconductor die may correspond to one channel.

Although example embodiments are described based on the example where two output CA signals are generated based on the two input CA signals and one CA signal group includes four sub-CA signals, e.g., based on the example where N=2 and M=4 in FIG. 1, the disclosure is not limited thereto. For example, the semiconductor memory device may operate using any number of CA signals, and may generate one output CA signal by selectively multiplexing two or more input CA signals depending on operation modes.

Figure 13:
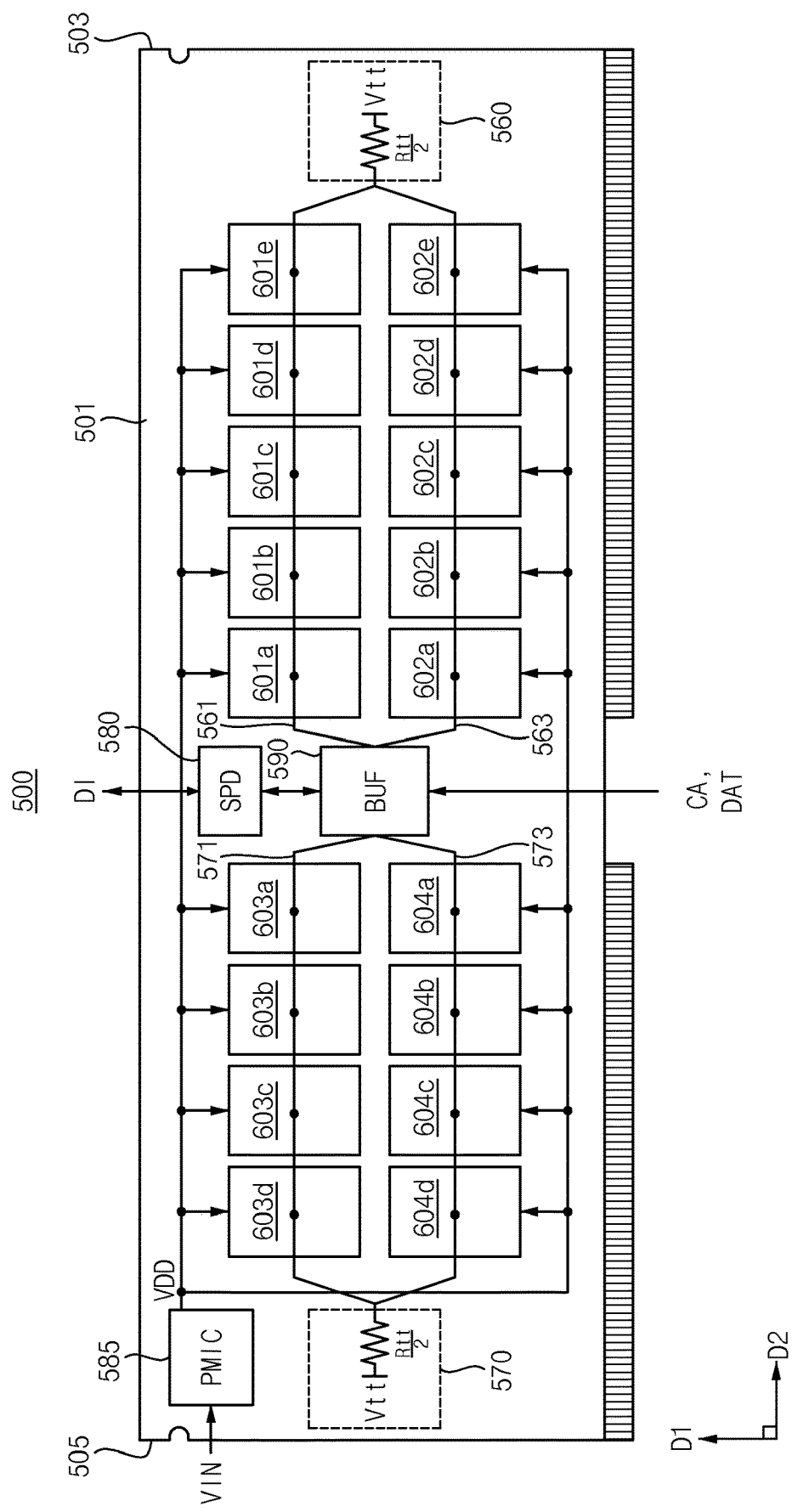
FIGS. 13 and 14 are block diagrams illustrating a memory module according to an example embodiment.
Figure 14:
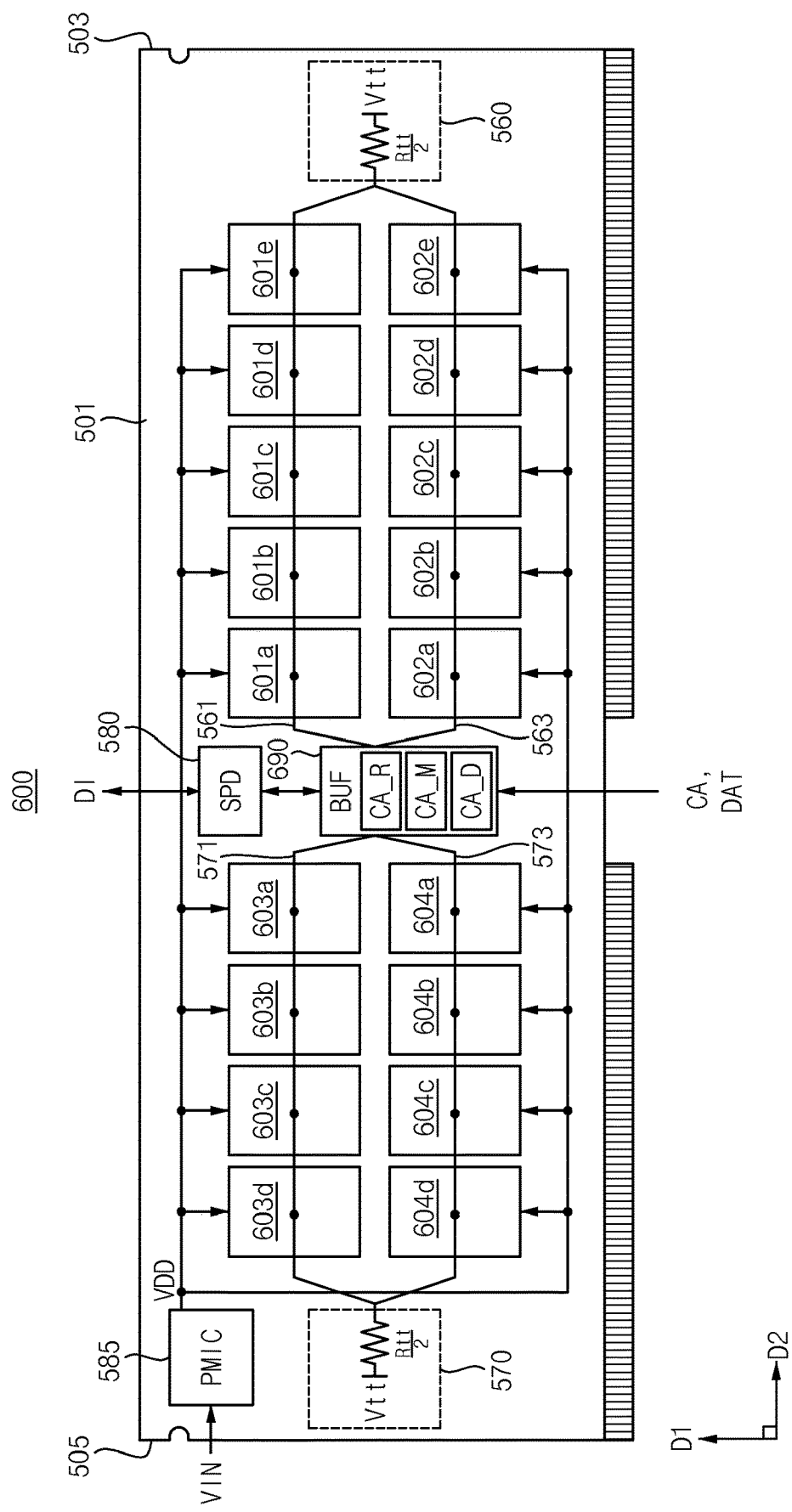

FIGS. 13 and 14 are block diagrams illustrating a memory module according to example embodiments.

Referring to FIG. 13, a memory module 500 may include a buffer chip (BUF) 590 (e.g., a registered clock driver (RCD)), a plurality of semiconductor memory devices 601a, 601b, 601c, 601d, 601e, 602a, 602b, 602c, 602d, 602e, 603a, 603b, 603c, 603d, 604a, 604b, 604c and 604d, module resistance units 560 and 570, a serial present detection (SPD) chip 580, and/or a power management integrated circuit (PMIC) 585 that are disposed in or mounted on a circuit board 501.

The buffer chip 590 may control the semiconductor memory devices 601a to 601e, 602a to 602e, 603a to 603d and 604a to 604d, and the PMIC 585, under a control of a memory controller (e.g., the memory controller 20 in FIG. 2). For example, the buffer chip 590 may receive the command/address (CA) signal CA and the data DAT from the memory controller.

The SPD chip 580 may be a programmable read only memory (PROM) (e.g., an electrically erasable PROM (EEPROM)). The SPD chip 580 may store initial information and/or device information DI of the memory module 500. In some example embodiments, the SPD chip 580 may store the initial information and/or the device information DI such as a module form, a module configuration, a storage capacity, a module type, an execution environment, and/or the like of the memory module 500.

When a memory system including the memory module 500 is booted up, the memory controller may read the device information DI from the SPD chip 580, and may recognize the memory module 500 based on the device information DI.

The memory controller may control the memory module 500 based on the device information DI from the SPD chip 580. For example, the memory controller may recognize a type of the semiconductor memory devices included in the memory module 500 based on the device information DI from the SPD chip 580.

Here, the circuit board 501 which is a printed circuit board (PCB) may extend in a second direction D2, perpendicular to a first direction D1, between a first edge portion 503 and a second edge portion 505. The first edge portion 503 and the second edge portion 505 may extend in the first direction D1. The buffer chip 590 may be on a center of the circuit board 501. The plurality of semiconductor memory devices 601a to 601e, 602a to 602e, 603a to 603d and 604a to 604d may be arranged in a plurality of rows between the buffer chip 590 and the first edge portion 503, and between the buffer chip 590 and the second edge portion 505. In some example embodiments, operations described herein as being performed by the buffer chip 590 may be performed by processing circuitry.

In this example, the semiconductor memory devices 601a to 601e and 602a to 602e may be arranged along a plurality of rows between the buffer chip 590 and the first edge portion 503. The semiconductor memory devices 603a to 603d and 604a to 604d may be arranged along a plurality of rows between the buffer chip 590 and the second edge portion 505. The semiconductor memory devices 601a to 601d, 602a to 602d, 603a to 603d and 604a to 604d may be referred to as data chips storing the actual data, and the semiconductor memory devices 601e and 602e may be referred to as parity chips storing error correction code (ECC) information (e.g., parity bits).

The buffer chip 590 may provide CA signals to the semiconductor memory devices 601a to 601e through CA transmission lines (or CA lines) 561, and may provide CA signals to the semiconductor memory devices 602a to 602e through CA transmission lines 563. In addition, the buffer chip 590 may provide CA signals to the semiconductor memory devices 603a to 603d through CA transmission lines 571, and may provide CA signals to the semiconductor memory devices 604a to 604d through CA transmission lines 573.

The CA transmission lines 561 and 563 may be connected in common to the module resistance unit 560 disposed to be adjacent to the first edge portion 503, and the CA transmission lines 571 and 573 may be connected in common to the module resistance unit 570 disposed to be adjacent to the second edge portion 505. Each of the module resistance units 560 and 570 may include a termination resistor Rtt/2 connected to a node receiving a termination voltage Vtt.

Each of the plurality of semiconductor memory devices 601a to 601e, 602a to 602e, 603a to 603d and 604a to 604d may be the semiconductor memory device according to example embodiments. For example, each of the semiconductor memory devices 601a to 601e, 602a to 602e, 603a to 603d and 604a to 604d may be semiconductor memory device 100, 40, 100a, 102, 102a, 102b, 104, 104a, etc. For example, each of or at least one of the plurality of semiconductor memory devices 601a to 601e, 602a to 602e, 603a to 603d and 604a to 604d may be or include a DRAM.

The SPD chip 580 may be adjacent to the buffer chip 590, and the PMIC 585 may be between the semiconductor memory device 603d and the second edge portion 505. The PMIC 585 may generate a power supply voltage VDD based on an input voltage VIN, and may provide the power supply voltage VDD to the semiconductor memory devices 601a to 601e, 602a to 602e, 603a to 603d and 604a to 604d.

Referring to FIG. 14, a memory module 600 may include a buffer chip 690, a plurality of semiconductor memory devices 601a to 601e, 602a to 602e, 603a to 603d and 604a to 604d, module resistance units 560 and 570, a SPD chip 580, and/or a PMIC 585 that are disposed in or mounted on a circuit board 501.

The memory module 600 may be substantially the same as the memory module 500 of FIG. 13, except that a configuration of the buffer chip 690 is changed. The descriptions repeated with FIG. 13 will be omitted.

The buffer chip 690 may include a receiving circuit CA_R, a multiplexing circuit CA_M and a decoding circuit CA_D for receiving and decoding the CA signal CA.

The receiving circuit CA_R, the multiplexing circuit CA_M and the decoding circuit CA_D may be substantially the same as the receiving circuit 110, the multiplexing circuit 120 and the decoding circuit 130 in FIG. 1, respectively. The receiving circuit CA_R may receive a plurality of input CA signals (e.g., the input CA signals ICA_1 to ICA_N in FIG. 1), and may generate a plurality of CA signal groups (e.g., the CA signal groups CA_G_1 to CA_G_N in FIG. 1) based on a clock signal (e.g., the clock signal CK in FIG. 1) and the plurality of input CA signals. Based on a mode selection signal (e.g., the mode selection signal SEL in FIG. 1), the multiplexing circuit CA_M may output the plurality of CA signal groups as a plurality of selected CA signal groups (e.g., the selected CA signal groups CA_S_1 to CA_S_N in FIG. 1) in the first operation mode, and may generate the plurality of selected CA signal groups by multiplexing the plurality of sub-CA signals included in the plurality of CA signal groups in the second operation mode. The decoding circuit CA_D may generate a plurality of output CA signals (e.g., the output CA signals OCA_1 to OCA_N in FIG. 1) based on the plurality of selected CA signal groups.

The plurality of semiconductor memory devices 601a to 601e, 602a to 602e, 603a to 603d and 604a to 604d may operate based on the plurality of output CA signals. For example, the semiconductor memory devices 601a to 601e and 602a to 602e connected to the CA transmission lines 561 and 563 may operate based on a first output CA signal, and the semiconductor memory devices 603a to 603d and 604a to 604d connected to the CA transmission lines 571 and 573 may operate based on a second output CA signal. For example, the semiconductor memory devices 601a to 601e and 602a to 602e operating based on the first output CA signal and the semiconductor memory devices 603a to 603d and 604a to 604d operating based on the second output CA signal may operate independently of each other.

Figure 15:
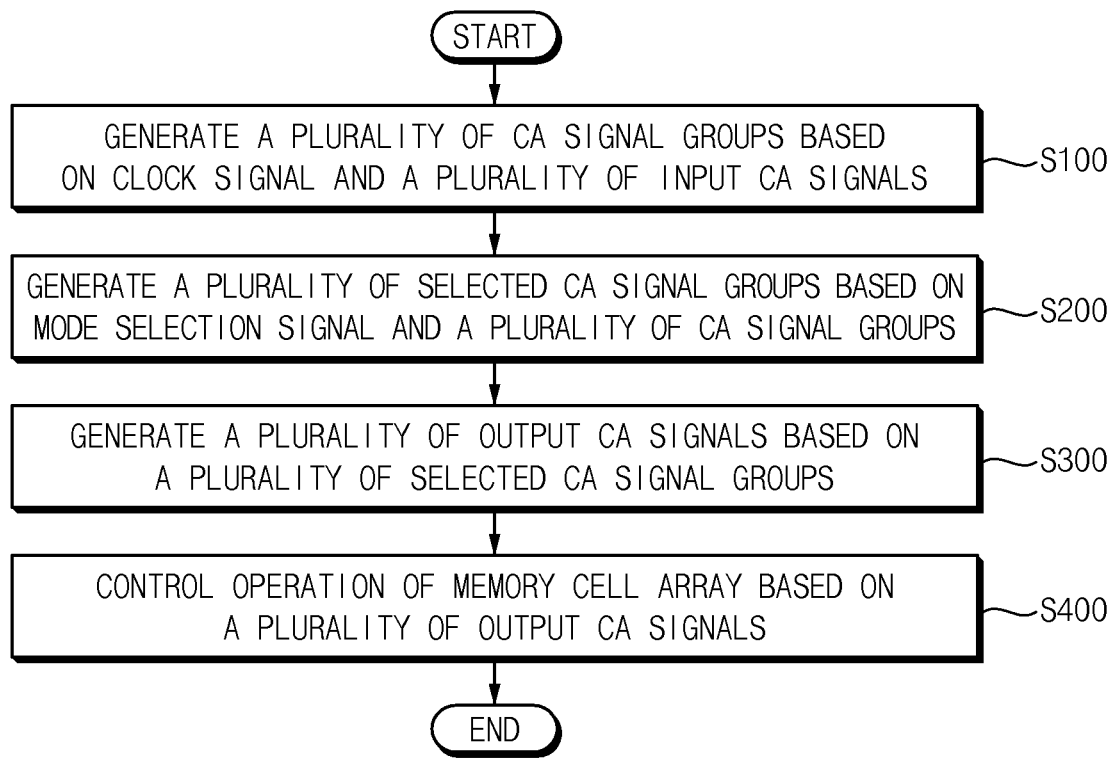
FIG. 15 is a flowchart illustrating a method of operating a semiconductor memory device according to an example embodiment.

FIG. 15 is a flowchart illustrating a method of operating a semiconductor memory device according to an example embodiment.

Referring to FIGS. 1 and 15, in a method of operating the semiconductor memory device 100 according to an example embodiment, the plurality of CA signal groups CA_G_1 to CA_G_N are generated based on the clock signal CK and the plurality of input CA signals ICA_1 to ICA_N (step S100). The plurality of selected CA signal groups CA_S_1 to CA_S_N are generated based on the mode selection signal SEL and the plurality of CA signal groups CA_G_1 to CA_G_N (step S200). The plurality of output CA signals OCA_1 to OCA_N are generated based on the plurality of selected CA signal groups CA_S_1 to CAS_N (step S300). The operation of the memory cell array 140 is controlled based on the plurality of output CA signals OCA_1 to OCA_N (step S400). In some example embodiments, the method of FIG. 15 may be described as a method of operating the memory module 600 of FIG. 14.

Figure 16:
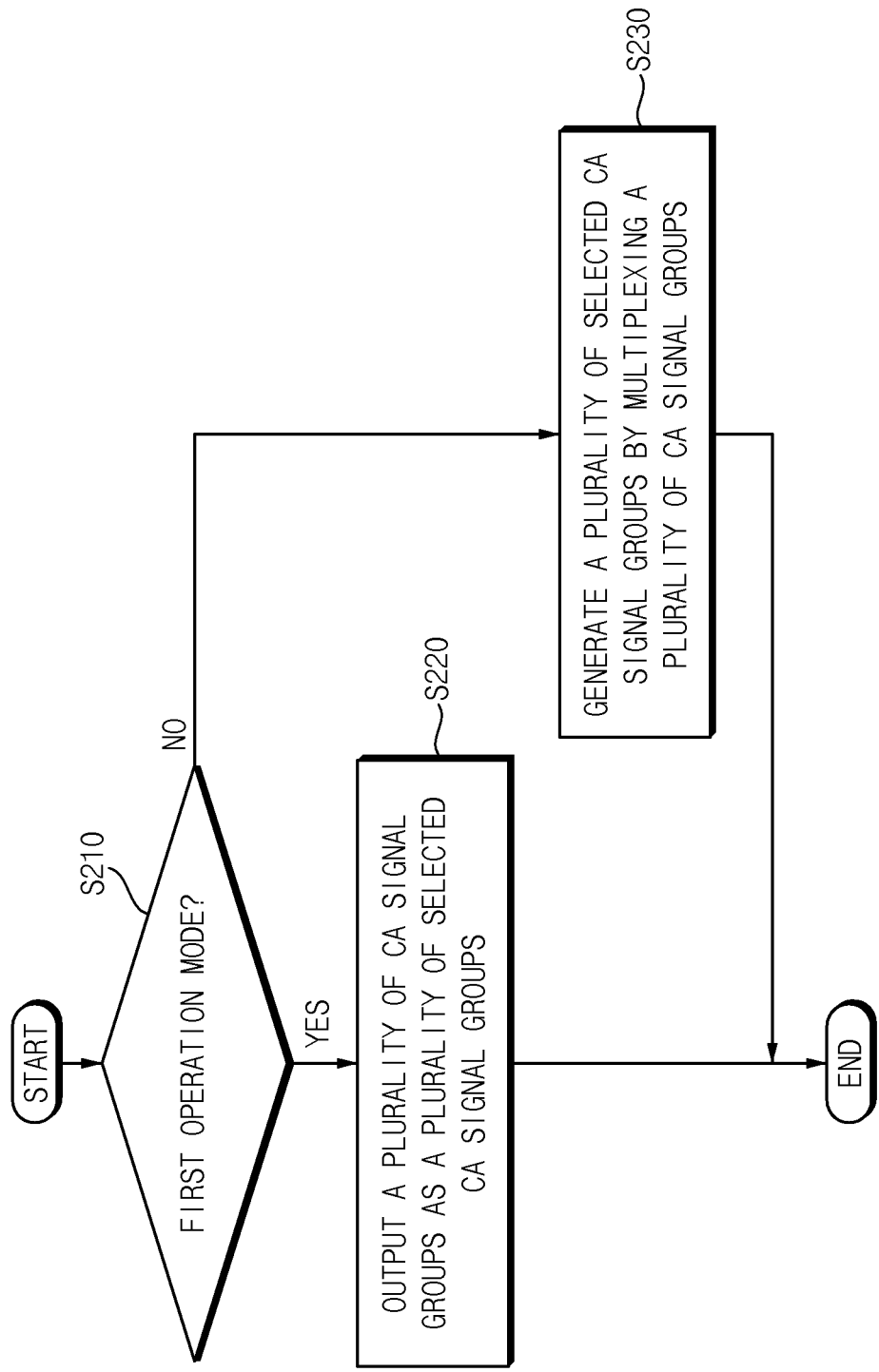
FIG. 16 is a flowchart illustrating an example of generating a plurality of selected CA signal groups in FIG. 15.

FIG. 16 is a flowchart illustrating an example of generating a plurality of selected CA signal groups in FIG. 15.

Referring to FIGS. 1, 15 and 16, when generating the plurality of selected CA signal groups CA_S_1 to CA_S_N (step S200), in the first operation mode (step S210: YES), the plurality of CA signal groups CA_G_1 to CA_G_N may be output as the plurality of selected CA signal groups CA_S_1 to CA_S_N (step S220). For example, each selected CA signal group may include signals based on a single one of the input CA signals during the first operation mode. In the second operation mode (step S210: NO), the plurality of selected CA signal groups CA_S_1 to CA_S_N may be generated by multiplexing the plurality of sub-CA signals included in the plurality of CA signal groups CA_G_1 to CA_G_N (step S230). For example, each selected CA signal group may include signals based on two or more of the input CA signals during the second operation mode. For example, steps S210, S220 and S230 may be performed as described with reference to FIGS. 4, 5A, 5B, 6A and 6B.

As will be appreciated by those skilled in the art, the inventive concept may be embodied as a system, method, computer program product, and/or a computer program product embodied in one or more computer readable medium(s) having computer readable program code embodied thereon. The computer readable program code may be provided to a processor of a general purpose computer, special purpose computer, or other programmable data processing apparatus. The computer readable medium may be a computer readable signal medium or a computer readable storage medium. The computer readable storage medium may be any tangible medium that can contain or store a program for use by or in connection with an instruction execution system, apparatus, or device. For example, the computer readable medium may be a non-transitory computer readable medium.

Figure 17:
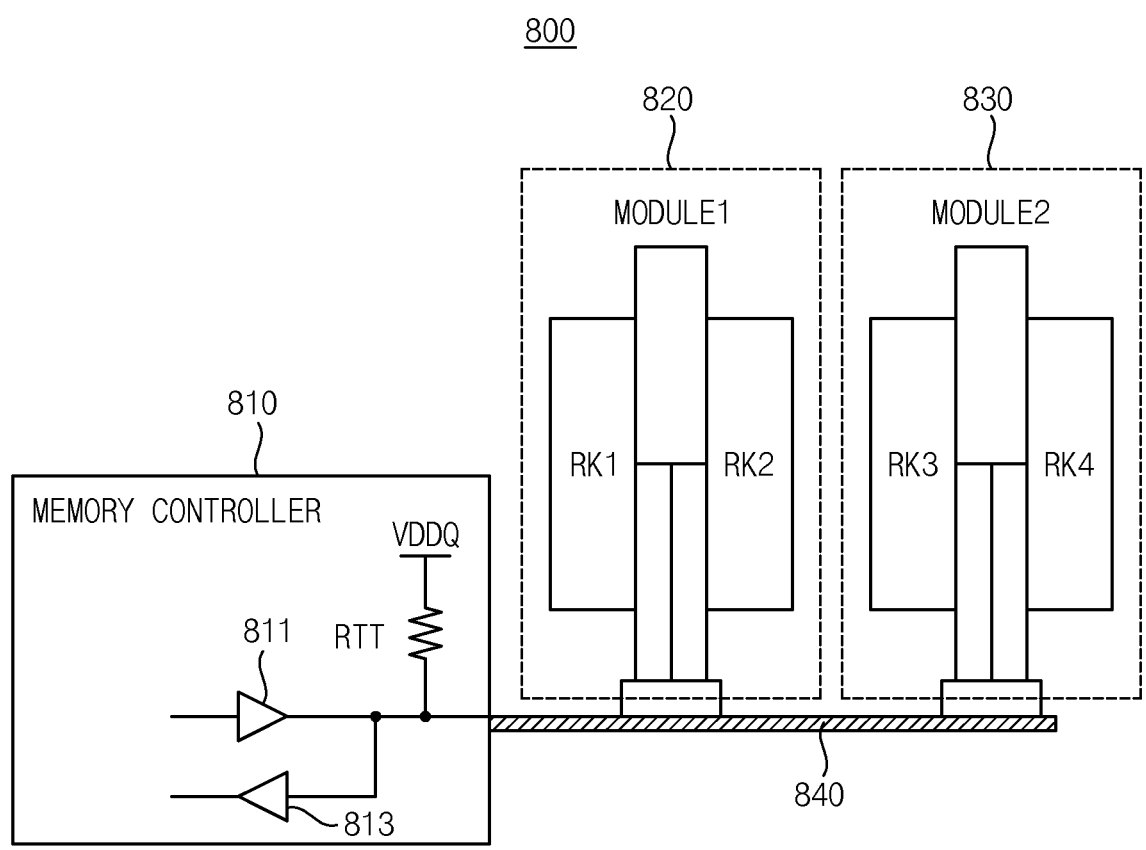
FIG. 17 is a block diagram illustrating a memory system including a memory module according to an example embodiment.

FIG. 17 is a block diagram illustrating a memory system including a memory module according to an example embodiment.

Referring to FIG. 17, a memory system 800 may include a memory controller 810 and/or memory modules 820 and 830. For example, the memory modules 820 and 830 may be quad-rank memory modules. While two memory modules are depicted in FIG. 17, more or fewer memory modules may be included in the memory system 800, according to example embodiments.

The memory controller 810 may control the memory modules 820 and/or 830 so as to perform a command supplied from a processor and/or a host. The memory controller 810 may be implemented using processing circuitry (e.g., a processor) and/or may be implemented with a host, an application processor (AP) or a system-on-a-chip (SoC). For signal integrity, a source termination may be implemented with a resistor RTT on a bus 840 of the memory controller 810. The resistor RTT may be connected to a power supply voltage VDDQ. The memory controller 810 may include a transmitter 811 that may transmit a signal to at least one of the memory modules 820 and/or 830, and a receiver 813 that may receive a signal from at least one of the memory modules 820 and/or 830.

The memory modules 820 and 830 may be referred to as a first memory module 820 and a second memory module 830. The first memory module 820 and the second memory module 830 may be connected to the memory controller 810 through the bus 840. Each of the first memory module 820 and the second memory module 830 may correspond to the memory module 500 of FIG. 13 and/or the memory module 600 of FIG. 14. The first memory module 820 may include memory ranks RK1 and RK2, and the second memory module 830 may include memory ranks RK3 and RK4.

Figure 18:
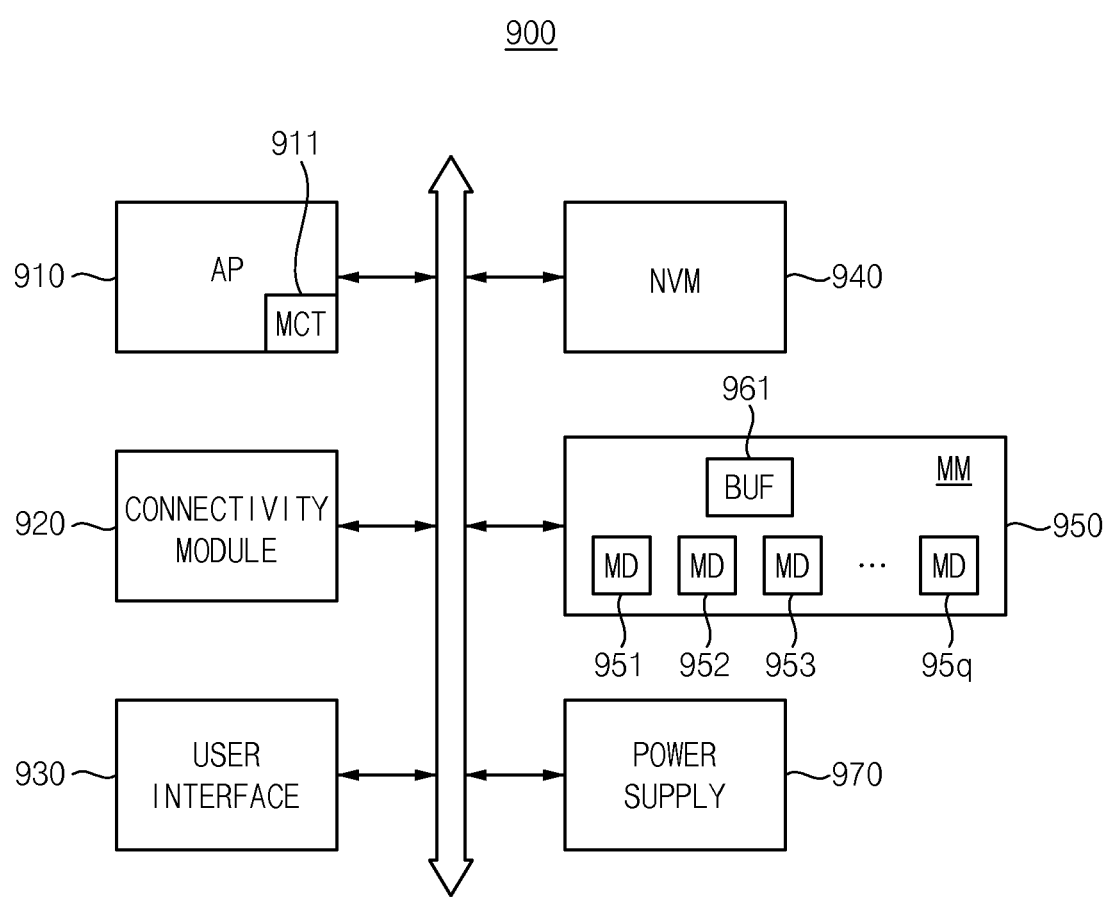
FIG. 18 is a block diagram illustrating an electronic system including a memory module according to an example embodiment.

FIG. 18 is a block diagram illustrating an electronic system including a memory module according to an example embodiment.

Referring to FIG. 18, an electronic system 900 may include an application processor (AP) 910, a connectivity module 920, a user interface 930, a nonvolatile memory (NVM) device 940, a memory module (MM) 950 such as a dual in-line memory module (DIMM), and/or a power supply 970. For example, the electronic system 900 may be a mobile system.

The application processor 910 may include a memory controller (MCT) 911. The application processor 910 may execute applications, such as at least one of a web browser, a game application, a video player, etc. The connectivity module 920 may perform wired and/or wireless communication with an external device. For example, the connectivity module 920 may be a transceiver.

The memory module 950 may store data processed by the application processor 910 and/or operate as a working memory. The memory module 950 may include a plurality of memory devices (MD) 951, 952, 953, ..., 95q, and/or a buffer chip (BUF) 961. The memory module 950 may correspond to the memory module 500 of FIG. 13 and/or the memory module 600 of FIG. 14.

The nonvolatile memory device 940 may store a boot image for booting the electronic system 900. The user interface 930 may include at least one input device, such as a keypad, a touch screen, etc., and at least one output device, such as a speaker, a display device, etc. The power supply 970 may supply an operating voltage to the electronic system 900.

The electronic system 900 or components of the electronic system 900 may be mounted using various types of packages.

Figure 19:
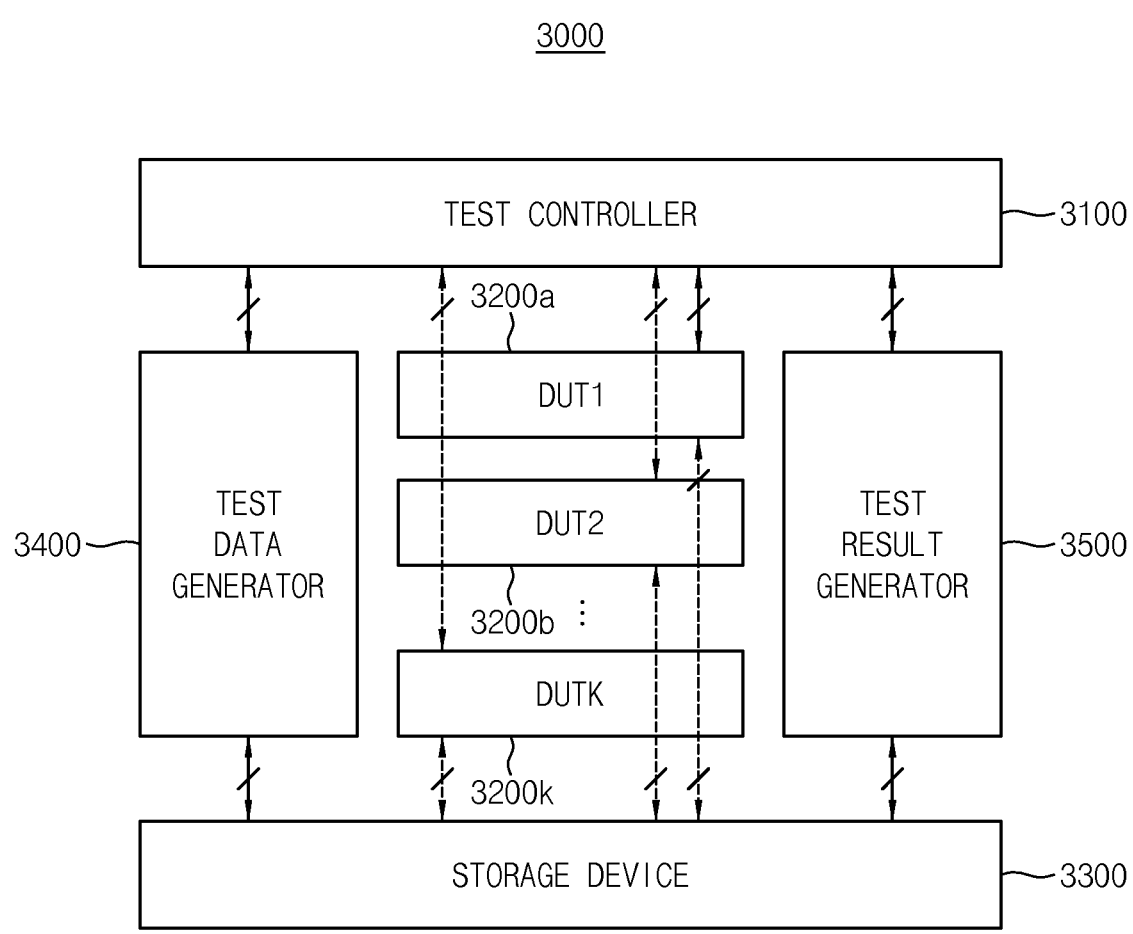
FIG. 19 is a block diagram illustrating a test equipment for testing a semiconductor memory device according to an example embodiment.

FIG. 19 is a block diagram illustrating a test equipment for testing a semiconductor memory device according to an example embodiment.

Referring to FIG. 19, a test equipment 3000 may include a test controller 3100 (e.g., a control circuit), a plurality of devices under test (DUT1, DUT2, ..., DUTK) 3200a, 3200b, ... 3200k, a storage device 3300, a test data generator 3400 (e.g., a circuit) and a test result generator 3500 (e.g., a circuit).

The test controller 3100 may control a test for each of the plurality of devices under test 3200a to 3200k by controlling elements included in the test equipment 3000. The storage device 3300 may store data for the test. The test data generator 3400 may generate a test signal to provide the test signal to the plurality of devices under test 3200a to 3200k. The test result generator 3500 may receive a test result signal from the plurality of devices under test 3200a to 3200k to determine whether or not each of the plurality of devices under test 3200a to 3200k is defective.

Each of the plurality of devices under test 3200a to 3200k may be the semiconductor memory device according to example embodiments, and may be implemented to support various operation modes including the normal operation mode and the low-speed operation mode. For example, the devices under test 3200a to 3200k may be semiconductor memory device 100, 40, 100a, 102, 102a, 102b, 104, 104a, etc. Even if the semiconductor memory device has relatively high operation speed and the rate of receiving the CA signals is relatively fast, the test operation may be performed on the semiconductor memory device using the test equipment in which the rate of transmitting the CA signals is relatively slow.

The inventive concept may be applied to various electronic devices and systems that include the semiconductor memory devices. For example, the inventive concept may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The foregoing is illustrative of example embodiments and is not to be construed as limiting thereof. Although some example embodiments have been described, those skilled in the art will readily appreciate that many modifications are possible in the example embodiments without materially departing from the example embodiments. Accordingly, all such modifications are intended to be included within the scope of the example embodiments as defined in the claims.

What is claimed is:

1. A semiconductor memory device comprising:
   a receiving circuit configured to receive a plurality of input command/address (CA) signals, and to generate a plurality of CA signal groups based on the input CA signals and a clock signal, each of the plurality of CA signal groups including a first sub-signal representing a command and a second sub-signal representing an address associated with the command;
   a multiplexing circuit configured to output each of the plurality of CA signal groups as a corresponding selected CA signal group in a first operation mode, and output a plurality of selected CA signal groups by combining at least two of the CA signal groups into a single selected CA signal group in a second operation mode;
   a decoding circuit configured to generate a plurality of output CA signals based on the plurality of selected CA signal groups; and
   a memory cell array configured to operate based on the plurality of output CA signals.

2. The semiconductor memory device of claim 1,
   wherein the plurality of input CA signals include a first input CA signal,
   wherein the plurality of output CA signals include a first output CA signal,
   wherein, in the first operation mode, the first output CA signal is generated using the first input CA signal, and
   wherein, in the second operation mode, the first output CA signal is generated using at least two of the input CA signals.

3. The semiconductor memory device of claim 1, wherein a rate of receiving the plurality of input CA signals in the second operation mode is slower than a rate of receiving the plurality of input CA signals in the first operation mode.

4. The semiconductor memory device of claim 1, wherein the receiving circuit comprises:
   a first buffer configured to generate a first CA signal group among the CA signal groups including first sub-CA signals among the sub-CA signals based on the clock signal and a first input CA signal among the input CA signals; and
   a second buffer configured to generate a second CA signal group among the CA signal groups including second sub-CA signals among the sub-CA signals based on the clock signal and a second input CA signal among the input CA signals.

5. The semiconductor memory device of claim 4, wherein the multiplexing circuit comprises:
   a first multiplexer configured to select one of a first part of the first CA signal group and a first part of the second CA signal group based on the mode selection signal, and to output the selected one of the first part of the first CA signal group and the first part of the second CA signal group as a first part of a first selected CA signal group; and
   a second multiplexer configured to select one of a second part of the first CA signal group and a second part of the second CA signal group based on the mode selection signal, and to output the selected one of the second part of the first CA signal group and the second part of the second CA signal group as a first part of a second selected CA signal group.

6. The semiconductor memory device of claim 5,
   wherein, in response to the mode selection signal having a first logic level, the first multiplexer is configured to select the first part of the first CA signal group and to output the first part of the first CA signal group as the first part of the first selected CA signal group, and
   wherein, in response to the mode selection signal having the first logic level, the second multiplexer is configured to select the second part of the second CA signal group and to output the second part of the second CA signal group as the first part of the second selected CA signal group.

7. The semiconductor memory device of claim 6,
   wherein, in response to the mode selection signal having a second logic level different from the first logic level, the first multiplexer is configured to select the first part of the second CA signal group and to output the first part of the second CA signal group as the first part of the first selected CA signal group, and
   wherein, in response to the mode selection signal having the second logic level, the second multiplexer is configured to select the second part of the first CA signal group and to output the second part of the first CA signal group as the first part of the second selected CA signal group.

8. The semiconductor memory device of claim 5,
   wherein the second part of the first CA signal group is output as a second part of the first selected CA signal group, and
   wherein the first part of the second CA signal group is output as a second part of the second selected CA signal group.

9. The semiconductor memory device of claim 5, wherein the decoding circuit comprises:
   a first decoder configured to generate a first output CA signal based on the first selected CA signal group; and
   a second decoder configured to generate a second output CA signal based on the second selected CA signal group.

10. The semiconductor memory device of claim 1, further comprising:
    a clock generating circuit configured to generate a plurality of driving clock signals based on the clock signal, and wherein the receiving circuit is configured to generate the plurality of CA signal groups based on the plurality of driving clock signals.

11. The semiconductor memory device of claim 10, wherein the clock generating circuit comprises:
a clock divider configured to generate common driving clock signals based on the clock signal,
wherein the receiving circuit comprises:
a first buffer configured to generate a first CA signal group among the CA signal groups based on a first input CA signal among the input CA signals; and
a second buffer configured to generate a second CA signal group among the CA signal groups based on a second input CA signal among the input CA signals, and
wherein the first and second buffers are configured to operate based on the common driving clock signals.

12. The semiconductor memory device of claim 10, wherein the clock generating circuit comprises:
a first clock divider configured to generate first driving clock signals among the driving clock signals based on a first clock signal; and
a second clock divider configured to generate second driving clock signals among the driving clock signals based on a second clock signal,
wherein the receiving circuit comprises:
a first buffer configured to generate a first CA signal group among the CA signal groups based on a first input CA signal among the input CA signals; and
a second buffer configured to generate a second CA signal group among the CA signal groups based on a second input CA signal among the input CA signals,
wherein the first buffer is configured to operate based on the first driving clock signals, and
wherein the second CA buffer is configured to operate based on the second driving clock signals.

13. The semiconductor memory device of claim 1, wherein the plurality of input CA signals are received through a plurality of channels that are different from each other.

14. The semiconductor memory device of claim 13, wherein the memory cell array includes a plurality of memory regions, and
wherein the plurality of memory regions are configured to operate independently based on the plurality of output CA signals.

15. The semiconductor memory device of claim 14, wherein a first memory region among the plurality of memory regions is disposed on a first semiconductor die, and
wherein a second memory region among the plurality of memory regions is disposed on a second semiconductor die stacked on the first semiconductor die.

16. The semiconductor memory device of claim 1, wherein the second operation mode is a test mode in which a test operation is performed on the memory cell array.

17. The semiconductor memory device of claim 1, wherein the semiconductor memory device is a dynamic random access memory (DRAM).

18. A memory module comprising:
a circuit board;
a plurality of semiconductor memory devices disposed on the circuit board; and
a buffer chip disposed on the circuit board, the buffer chip configured to control the plurality of semiconductor memory devices,
wherein the buffer chip comprises:
a receiving circuit configured to receive a plurality of input command/address (CA) signals, and to generate a plurality of CA signal groups based on the input CA signals and a clock signal, each of the plurality of CA signal groups including a first sub-signal representing a command and a second sub-signal representing an address associated with the command;
a multiplexing circuit configured to output each of the plurality of CA signal groups as a corresponding selected CA signal group in a first operation mode, and output a plurality of selected CA signal groups by combining at least two of the CA signal groups into a single selected CA signal group in a second operation mode; and
a decoding circuit configured to generate a plurality of output CA signals based on the plurality of selected CA signal groups, and
wherein the plurality of semiconductor memory devices are configured to operate based on the plurality of output CA signals.

19. The memory module of claim 18,
wherein a first semiconductor memory device is configured to operate based on a first output CA signal among the output CA signals, and
wherein a second semiconductor memory device is configured to operate independently of the first semiconductor memory device based on a second output CA signal among the output CA signals.

20. A semiconductor memory device comprising:
a first buffer configured to receive a first input command/address (CA) signal through a first channel, and to generate first through X-th sub-CA signals based on a clock signal and the first input CA signal, where X is an even number greater than or equal to two;
a second buffer configured to receive a second input CA signal through a second channel different from the first channel, and to generate (X+1)-th to 2X-th sub-CA signals based on the clock signal and the second input CA signal;
a first multiplexer configured to output the first to X/2-th sub-CA signals as first to X/2-th selected CA signals in a first operation mode, and to output the (X+1)-th to 3X/2-th sub-CA signals as the first to X/2-th selected CA signals in a second operation mode;
a second multiplexer configured to output the (3X/2+1)-th to 2X-th sub-CA signals as (X/2+1)-th to X-th selected CA signals in the first operation mode, and to output the (X/2+1)-th to X-th sub-CA signals as the (X/2+1)-th to X-th selected CA signals in the second operation mode;
a first decoder configured to generate a first output CA signal based on the first to X/2-th selected CA signals and the (X/2+1)-th to X-th sub-CA signals;
a second decoder configured to generate a second output CA signal based on the (X/2+1)-th to X-th selected CA signals and the (X+1)-th to 3X/2-th sub-CA signals; and
a memory cell array comprising:
a first memory region configured to operate based on the first output CA signal; and
a second memory region configured to operate independently of the first memory region based on the second output CA signal,
wherein the second operation mode is a test mode in which a test operation is performed on the memory cell array, and wherein a rate of receiving the first and second input CA signals in the second operation mode is slower than a rate of receiving the first and second input CA signals in the first operation mode.

* * * * *